United States Patent
Iwano et al.

(10) Patent No.: US 11,773,291 B2
(45) Date of Patent: *Oct. 3, 2023

(54) POLISHING LIQUID, POLISHING LIQUID SET, AND POLISHING METHOD

(71) Applicant: HITACHI CHEMICAL COMPANY, LTD., Tokyo (JP)

(72) Inventors: Tomohiro Iwano, Tokyo (JP); Takaaki Matsumoto, Tokyo (JP); Tomoyasu Hasegawa, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/497,558

(22) PCT Filed: Jan. 29, 2018

(86) PCT No.: PCT/JP2018/002788
§ 371 (c)(1),
(2) Date: Sep. 25, 2019

(87) PCT Pub. No.: WO2018/179787
PCT Pub. Date: Oct. 4, 2018

(65) Prior Publication Data
US 2020/0032106 A1  Jan. 30, 2020

(30) Foreign Application Priority Data

Mar. 27, 2017 (WO) ............... PCT/JP2017/012421

(51) Int. Cl.
*C09G 1/02* (2006.01)
*C08K 3/20* (2006.01)
(Continued)

(52) U.S. Cl.
CPC ............. *C09G 1/02* (2013.01); *C08K 3/20* (2013.01); *C08K 5/09* (2013.01); *C08K 5/17* (2013.01);
(Continued)

(58) Field of Classification Search
CPC ... C09G 1/02; C08K 3/20; C08K 5/09; C08K 5/17; C08K 2003/2213; C08L 71/02;
(Continued)

(56) References Cited

U.S. PATENT DOCUMENTS 5,543,126 A  8/1996  Ota
6,939,211 B2  9/2005  Taylor
(Continued)

FOREIGN PATENT DOCUMENTS

CN  103189457  7/2013
CN  103339219  10/2013
(Continued)

OTHER PUBLICATIONS

A. Solt, "13.1 Amino Acids," Chemistry Libre Texts, Chem.Libretext.org, 2021 (Cited in Office Action dated May 25, 2021 in U.S. Appl. No. 16/981,573).
(Continued)

*Primary Examiner* — Shahim Ahmed
(74) *Attorney, Agent, or Firm* — Fitch, Even, Tabin & Flannery, L.L.P.

(57) ABSTRACT

A polishing liquid containing abrasive grains, a hydroxy acid, a polyol, a cationic compound, and a liquid medium, in which a zeta potential of the abrasive grains is positive and a weight average molecular weight of the cationic compound is less than 1000.

21 Claims, 3 Drawing Sheets

(51) Int. Cl.
    *C08K 5/09* (2006.01)
    *C08K 5/17* (2006.01)
    *C08L 71/02* (2006.01)
    *H01L 21/304* (2006.01)
    *H01L 21/3105* (2006.01)
    *C09K 13/00* (2006.01)
    *H01L 21/306* (2006.01)
    *C08K 3/22* (2006.01)
    *C03C 15/02* (2006.01)

(52) U.S. Cl.
    CPC .............. *C08L 71/02* (2013.01); *C09K 13/00* (2013.01); *H01L 21/304* (2013.01); *H01L 21/30625* (2013.01); *H01L 21/31053* (2013.01); *C03C 15/02* (2013.01); *C08K 2003/2213* (2013.01)

(58) Field of Classification Search
    CPC .............. H01L 21/304; H01L 21/31053; H01L 21/30625; C09K 3/14; C09K 13/00; C03C 15/02
    See application file for complete search history.

(56) References Cited

U.S. PATENT DOCUMENTS

| | | | |
|---|---|---|---|
| 7,112,123 B2 * | 9/2006 | Fang | H01L 21/31053 451/28 |
| 2004/0065022 A1 * | 4/2004 | Machii | C09G 1/02 106/3 |
| 2004/0152309 A1 * | 8/2004 | Carter | C03C 19/00 438/689 |
| 2005/0119360 A1 * | 6/2005 | Kawakami | H01L 21/31695 521/77 |
| 2007/0044385 A1 * | 3/2007 | Yamada | C08G 18/4837 51/298 |
| 2011/0275285 A1 | 11/2011 | Satou | |
| 2012/0100718 A1 * | 4/2012 | Minami | H01L 21/3212 438/693 |
| 2012/0129346 A1 * | 5/2012 | Ryuzaki | B24B 37/044 438/693 |
| 2012/0299158 A1 | 11/2012 | Shinoda | |
| 2012/0329371 A1 * | 12/2012 | Iwano | C09K 3/1463 51/307 |
| 2013/0161285 A1 | 6/2013 | Li | |
| 2015/0140904 A1 | 5/2015 | Iwano | |
| 2015/0232704 A1 | 8/2015 | Akutsu | |
| 2015/0232705 A1 | 8/2015 | Kachi | |
| 2016/0024351 A1 | 1/2016 | Yoshida | |
| 2016/0108284 A1 | 4/2016 | Yoshizaki | |
| 2016/0137881 A1 * | 5/2016 | Oota | C09K 3/1409 451/57 |
| 2016/0319159 A1 * | 11/2016 | Minami | C09K 3/1472 |
| 2017/0183537 A1 | 6/2017 | Yoon | |
| 2017/0183538 A1 | 6/2017 | Kwon | |
| 2017/0292039 A1 | 10/2017 | Sato | |
| 2018/0043497 A1 | 2/2018 | Hanano | |
| 2018/0072917 A1 | 3/2018 | Kobayashi | |
| 2019/0211245 A1 | 7/2019 | Choi | |
| 2019/0256742 A1 | 8/2019 | Suzuki | |
| 2020/0299544 A1 | 9/2020 | Hanano | |
| 2021/0189175 A1 | 6/2021 | Gagliardi | |

FOREIGN PATENT DOCUMENTS

| | | | | |
|---|---|---|---|---|
| CN | 104334675 | | 2/2015 | |
| CN | 105895518 | | 8/2016 | |
| CN | 108010878 A | * | 5/2018 | |
| JP | H8-022970 A | | 1/1996 | |
| JP | H10-106994 A | | 4/1998 | |
| JP | 2005-513765 A | | 5/2005 | |
| JP | 2006-249129 A | | 9/2006 | |
| JP | 2007318072 | | 12/2007 | |
| JP | 2008112990 | | 5/2008 | |
| JP | 2009290188 | | 12/2009 | |
| JP | 2010-153781 A | | 7/2010 | |
| JP | 2011518098 | | 6/2011 | |
| JP | 4941430 | | 5/2012 | |
| JP | 2012186339 | | 9/2012 | |
| JP | 2013540851 | | 11/2013 | |
| JP | 201593932 | | 5/2015 | |
| JP | 2015-137297 A | | 7/2015 | |
| JP | 2015137297 | | 7/2015 | |
| JP | 2016029123 | | 3/2016 | |
| JP | 5943073 | | 6/2016 | |
| JP | 2016538359 | | 12/2016 | |
| JP | 201752858 | | 3/2017 | |
| JP | 2017203076 | | 11/2017 | |
| JP | 2018044046 | | 3/2018 | |
| KR | 1020170004462 | | 1/2017 | |
| KR | 102017003235 | | 3/2017 | |
| KR | 1737938 B1 | * | 5/2017 | ............... C09G 1/02 |
| KR | 1020170097090 | | 8/2017 | |
| KR | 1020180029888 | | 3/2018 | |
| TW | 201518489 | | 5/2015 | |
| TW | 201518492 | | 5/2015 | |
| TW | 201525118 | | 7/2015 | |
| TW | 201610126 | | 3/2016 | |
| TW | 201816060 | | 5/2018 | |
| WO | 97029510 | | 8/1997 | |
| WO | 02/067309 A1 | | 8/2002 | |
| WO | 2008146641 | | 12/2008 | |
| WO | 2009/131133 A1 | | 10/2009 | |
| WO | 2010/143579 A1 | | 12/2010 | |
| WO | 2012/070541 A1 | | 5/2012 | |
| WO | 2012/070542 A1 | | 5/2012 | |
| WO | 2012/070544 A1 | | 5/2012 | |
| WO | 2013/125441 A1 | | 8/2013 | |
| WO | 2014/199739 A1 | | 12/2014 | |
| WO | 2014208414 | | 12/2014 | |
| WO | 2015/052988 A1 | | 4/2015 | |
| WO | 2015098197 | | 7/2015 | |
| WO | 2016006553 | | 1/2016 | |
| WO | 2016143797 | | 9/2016 | |
| WO | 201743139 | | 3/2017 | |
| WO | 2018012174 | | 1/2018 | |
| WO | 2018048068 | | 3/2018 | |

OTHER PUBLICATIONS

International Search Report dated Dec. 11, 2018, for International Application No. PCT/JP2018/035456, together with English language translation.
Written Opinion of the International Searching Authority dated Dec. 11, 2018, for International Application No. PCT/JP2018/035456, together with English language translation.
International Search Report dated Sep. 24, 2019, for International Application No. PCT/JP2019/028712, together with English language translation.
Written Opinion of the International Searching Authority dated Sep. 27, 2019, for International Application No. PCT/JP2019/028712, together with English language translation.
International Search Report dated Aug. 1, 2019, for International Application No. PCT/JP2018/035441, together with English language translation.
Written Opinion of the International Searching Authority dated Aug. 1, 2019, for International Application No. PCT/JP2018/035441, together with English language translation.
International Search Report dated Dec. 25, 2018, for International Application No. PCT/JP2018/035443, together with English language translation.
Written Opinion of the International Searching Authority dated Dec. 25, 2018, for International Application No. PCT/JP2018/035443, together with English language translation.
International Search Report dated Aug. 1, 2019, for International Application No. PCT/JP2018/035463, together with English language translation.
Written Opinion of the International Searching Authority dated Aug. 1, 2019, for International Application No. PCT/JP2018/035463, together with English language translation.

(56) References Cited

OTHER PUBLICATIONS

"Wikipedia, "N-vinylpyrrolidone" via https://en.wikipedia.org/wiki/N-Vinylpyrrolidone", 2020, p. 1-p. 3 (cited in Office Action dated Mar. 9, 2021 in U.S. Appl. No. 16/981,589).

"Wikipedia, "Poly(N-vinylacetamide)" via https://en.wikipedia.org/wiki/Poly(N-vinylacetamide)", 2019, p. 1-p. 2 (cited in Office Action dated Mar. 9, 2021 in U.S. Appl. No. 16/981,589).

"Wikipedia, "Polyethylene glycol" via https://en.wikipedia.org/wiki/Polyethylene_glycol", 2021, p. 1-p. 11 (cited in Office Action dated Mar. 9, 2021 in U.S. Appl. No. 16/981,589).

"Wikipedia, "Tartaric acid" via https://en.wikipedia.org/wiki/Tartaric_acid", 2021, p. 1-p. 9 (cited in Office Action dated Mar. 9, 2021 in U.S. Appl. No. 16/981,589).

"Glyceric acid," https://en.wikipedia.org/wiki/Glyceric_acid, 2021, p. 1-p. 2 (Cited in Office Action dated May 10, 2021 in U.S. Appl. No. 16/981,589).

"Glycolic Acid," https://en.wikipedia.org/wiki/Glycolic_acid, 2021, p. 1-p. 5 (Cited in Office Action dated May 10, 2021 in U.S. Appl. No. 16/981,589).

"Lactic acid," https://en.wikipedia.org/wiki/Lactic_acid, 2021, p. 1-p. 11 (Cited in Office Action dated May 10, 2021 in U.S. Appl. No. 16/981,589).

Merrian Webster, Definition of "have," https://www.merriam-webster.com/dictionary/have, 2021, p. 1-p. 14 (Cited in Office Action dated May 10, 2021 in U.S. Appl. No. 16/981,589).

Merricks et al., "Evolution and Revolution of Cerium Oxide Slurries in CMP," Ferro Electronic Material Systems, 2015, pp. 1-6.

* cited by examiner

POLISHING LIQUID, POLISHING LIQUID SET, AND POLISHING METHOD

CROSS-REFERENCE TO RELATED APPLICATIONS

This application is a U.S. national phase application filed under 35 U.S.C. § 371 of International Application No. PCT/JP2018/002788, filed Jan. 29, 2018, designating the United States, which claims priority from International Application No. PCT/JP2017/012421, filed Mar. 27, 2017, which are hereby incorporated herein by reference in their entirety.

TECHNICAL FIELD

The present invention relates to a polishing liquid, a polishing liquid set, and a polishing method. In particular, the present invention relates to a polishing liquid, a polishing liquid set, and a polishing method which can be used in a flattening step of a base substrate surface that is a manufacturing technique for a semiconductor element. More specifically, the present invention relates to a polishing liquid, a polishing liquid set, and a polishing method which can be used in a flattening step of a shallow trench isolation (hereinafter, referred to as "STI") insulating material, a pre-metal insulating material, an interlayer insulating material, or the like.

BACKGROUND ART

In recent years, processing techniques for increasing density and miniaturization are becoming ever more important in manufacturing steps for semiconductor elements. CMP (chemical mechanical polishing) technique that is one of processing techniques has become an essential technique in manufacturing steps for semiconductor elements, for STI formation, flattening of pre-metal insulating materials or interlayer insulating materials, formation of plugs or embedded metal wirings, and the like.

As a polishing liquid most frequently used, for example, a silica-based polishing liquid containing particles of silica (silicon oxide) such as fumed silica or colloidal silica as abrasive grains is exemplified. The silica-based polishing liquid is characterized by being high in general versatility, and can polish broad types of materials irrespective of insulating materials and conductive materials by appropriately selecting an abrasive grain content, a pH, an additive, and the like.

Meanwhile, as a polishing liquid mainly used for insulating materials such as silicon oxide, a demand for a polishing liquid containing cerium compound particles as abrasive grains is also increasing. For example, a cerium oxide-based polishing liquid containing cerium oxide (ceria) particles as abrasive grains can polish silicon oxide at a high rate even when the abrasive grain content is lower than that in the silica-based polishing liquid (for example, see Patent Literatures 1 and 2 described below).

Incidentally, recently, as demand increases for achieving further miniaturization of wirings in manufacturing steps for semiconductor elements, generation of polishing scratches during polishing is becoming problematic. That is, even when fine polishing scratches are generated at the time of performing polishing using a conventional cerium oxide-based polishing liquid, the polishing scratches are not problematic as long as the sizes of these polishing scratches are smaller than a conventional wire width, but in a case where further miniaturization of wirings is tried to be achieved, the generation of polishing scratches becomes problematic even when the polishing scratches are fine.

For this problem, a polishing liquid using particles of hydroxides of a tetravalent metal element has been studied (for example, see Patent Literatures 3 to 5 described below). In addition, a method for producing particles of hydroxides of a tetravalent metal element has also been studied (for example, see Patent Literatures 6 and 7 described below). These techniques are aimed at reducing particle-induced polishing scratches by minimizing the mechanical action as much as possible while maintaining the chemical action of particles of hydroxides of a tetravalent metal element.

Further, in CMP steps or the like for formation of STIs, a laminated body, which has a stopper (a polishing stop layer containing a stopper material) disposed on a convex portion of a substrate having a concavity and convexity pattern and an insulating material (for example, silicon oxide) disposed on the substrate and the stopper so as to fill a concave portion of the concavity and convexity pattern, is polished. In such polishing, the polishing of the insulating material is stopped by the stopper. That is, the polishing of the insulating material is stopped when the stopper is exposed. The reason for this is that it is difficult to artificially control the amount of the insulating material polished (the amount of the insulating material removed), and the degree of polishing is controlled by polishing the insulating material until the stopper is exposed. In this case, the polishing selectivity of the insulating material with respect to the stopper material (polishing rate ratio: the polishing rate for the insulating material/the polishing rate for the stopper material) is necessary to increase. For this problem, Patent Literature 8 described below discloses a polishing liquid which contains particles of hydroxides of a tetravalent metal element and at least one of a cationic polymer and polysaccharide. In addition, Patent Literature 9 described below discloses a polishing liquid which contains particles of hydroxides of a tetravalent metal element and polyvinyl alcohol having a saponification degree of 95 mol % or less.

CITATION LIST

Patent Literature

Patent Literature 1: Japanese Unexamined Patent Publication No. H10-106994
Patent Literature 2: Japanese Unexamined Patent Publication No. H08-022970
Patent Literature 3: International Publication No. WO 2002/067309
Patent Literature 4: International Publication No. WO 2012/070541
Patent Literature 5: International Publication No. WO 2012/070542
Patent Literature 6: Japanese Unexamined Patent Publication No. 2006-249129
Patent Literature 7: International Publication No. WO 2012/070544
Patent Literature 8: International Publication No. WO 2009/131133
Patent Literature 9: International Publication No. WO 2010/143579

SUMMARY OF INVENTION

Technical Problem

In recent years, in the CMP step or the like for formation of STIs, it is necessary to further improve the polishing selectivity of the insulating material with respect to the stopper material for the purposes of improving flatness, suppressing erosion (over-polishing of the stopper), and the like.

The present invention is to solve the above-described problems, and an object thereof is to provide a polishing liquid, a polishing liquid set, and a polishing method which can improve polishing selectivity of an insulating material with respect to a stopper material.

Solution to Problem

In this regard, the present inventors have found that, by concurrently using abrasive grains (cationic abrasive grains) having a positive zeta potential, a hydroxy acid, a polyol, and a cationic compound having a weight average molecular weight of less than 1000, an effect of further enhancing the polishing selectivity of the insulating material with respect to the stopper material as compared to the related arts is obtainable.

A polishing liquid of the present invention contains abrasive grains, a hydroxy acid, a polyol, a cationic compound, and a liquid medium, in which a zeta potential of the abrasive grains is positive and a weight average molecular weight of the cationic compound is less than 1000.

According to the polishing liquid of the present invention, an insulating material can be polished at a high polishing rate and a polishing rate for a stopper material can be sufficiently suppressed. According to such a polishing liquid, the polishing selectivity of the insulating material with respect to the stopper material (the polishing rate for the insulating material/the polishing rate for the stopper material) can be improved. In addition, according to the polishing liquid of the present invention, in CMP techniques for flattening STI insulating materials, pre-metal insulating materials, interlayer insulating materials, and the like, it is also possible to achieve a high degree of flattening of these insulating materials.

Incidentally, in general, as a content of the abrasive grains increases, polishing scratches tend to be easily generated. On the other hand, according to the polishing liquid of the present invention, since a sufficient polishing rate can be obtained even when the amount of the abrasive grains is small, by using a small amount of the abrasive grains, the insulating material can also be polished with few polishing scratches while achieving a sufficient polishing rate.

Further, in a conventional polishing liquid, an anionic polymer (polycarboxylic acid, polysulfonic acid, or the like) is used in order to suppress a polishing rate for a stopper material while increasing a polishing rate for an insulating material, in some cases. However, in the conventional polishing liquid, in a case where the anionic polymer is used in a polishing liquid using cationic abrasive grains, the aggregation of the abrasive grains occurs, and thus, the effect of suppressing the generation of polishing scratches and the effect of increasing the polishing rate for the insulating material cannot be obtained in some cases. On the other hand, according to the polishing liquid of the present invention, while suppressing the aggregation of the abrasive grains (while keeping dispersion stability), the insulating material can be polished at a high polishing rate and the polishing rate for the stopper material can be sufficiently suppressed.

Further, the present inventors have found that, by concurrently using abrasive grains having a positive zeta potential, a hydroxy acid, a polyol, and a cationic compound having a weight average molecular weight of less than 1000, in addition to the effect of further enhancing the polishing selectivity of the insulating material with respect to the stopper material as compared to the related arts, an effect that a substrate having irregularities can be polished with favorable flatness is obtainable. According to the polishing liquid of the present invention, the polishing selectivity of the insulating material with respect to the stopper material can be improved and the polishing rate for the stopper material at the convex pattern in polishing of the insulating material by using the stopper can be suppressed.

The polyol preferably contains polyether polyol. The polyol preferably contains a polyol not having an aromatic group.

The hydroxy acid preferably contains a saturated monocarboxylic acid. A hydroxyl value of the hydroxy acid is preferably 1500 or less.

The abrasive grains preferably contain at least one selected from the group consisting of ceria, silica, alumina, zirconia, yttria, and a hydroxide of a tetravalent metal element. According to this, the insulating material can be polished at a further higher polishing rate.

A content of the polyol is preferably 0.05 to 5.0% by mass. According to this, while protecting the surface to be polished, the insulating material is easily polished at an appropriate polishing rate and the polishing rate for the stopper material is easily suppressed. In addition, the generation of polishing scratches on the polished surface can be further suppressed.

A content of the hydroxy acid is preferably 0.01 to 1.0% by mass. According to this, the insulating material is easily polished at an appropriate polishing rate while protecting the stopper.

A content of the cationic compound is preferably 0.001 to 0.1% by mass. According to this, the insulating material can be polished at an appropriate polishing rate and the polishing rate for the stopper material (for example, silicon nitride and polysilicon) can be sufficiently suppressed.

An aspect of the present invention relates to use of the polishing liquid in polishing of a surface to be polished containing silicon oxide. That is, the polishing liquid of the present invention is preferably used for polishing a surface to be polished containing silicon oxide.

A polishing liquid set of the present invention contains constituent components of the polishing liquid separately stored as a first liquid and a second liquid, in which the first liquid contains the abrasive grains and a liquid medium, and the second liquid contains the hydroxy acid, the polyol, the cationic compound, and a liquid medium. According to the polishing liquid set of the present invention, the same effect as that of the polishing liquid of the present invention can be obtained.

A polishing method of the present invention may include a step of polishing a surface to be polished by using the polishing liquid or a step of polishing a surface to be polished by using a polishing liquid obtained by mixing the first liquid and the second liquid of the polishing liquid set. According to these polishing methods, by using the polishing liquid or the polishing liquid set, the same effect as that of the polishing liquid of the present invention can be obtained.

An aspect of a polishing method of the present invention is a polishing method for a base substrate having an insulating material and silicon nitride, and may include a step of selectively polishing the insulating material with respect to the silicon nitride by using the polishing liquid or a step of selectively polishing the insulating material with respect to the silicon nitride by using a polishing liquid obtained by mixing the first liquid and the second liquid of the polishing liquid set.

According to these polishing methods, by using the polishing liquid or the polishing liquid set, in the case of selectively polishing the insulating material with respect to the silicon nitride, the same effect as that of the polishing liquid of the present invention can be obtained.

Another aspect of a polishing method of the present invention is a polishing method for a base substrate having an insulating material and polysilicon, and may include a step of selectively polishing the insulating material with respect to the polysilicon by using the polishing liquid or a step of selectively polishing the insulating material with respect to the polysilicon by using a polishing liquid obtained by mixing the first liquid and the second liquid of the polishing liquid set. According to these polishing methods, by using the polishing liquid or the polishing liquid set, in the case of selectively polishing the insulating material with respect to the polysilicon, the same effect as that of the polishing liquid of the present invention can be obtained.

Advantageous Effects of Invention

According to the present invention, the insulating material (for example, silicon oxide) can be polished at a high polishing rate and the polishing rate for the stopper material (for example, silicon nitride and polysilicon) can be sufficiently suppressed so that the polishing selectivity of the insulating material with respect to the stopper material can be improved. In addition, according to the present invention, the polishing rate for the stopper material at the convex pattern in polishing of the insulating material by using the stopper can be suppressed.

According to the present invention, even when any of silicon nitride and polysilicon is used as the stopper material, polishing can be sufficiently stopped on the stopper. Particularly, in the case of using silicon nitride as the stopper material, the insulating material can be polished at a high polishing rate and the polishing rate for silicon nitride can be sufficiently suppressed. According to such a present invention, in polishing of the insulating material by using silicon nitride as the stopper material, when the stopper is exposed, excessive polishing of the stopper and the insulating material embedded in the concave portion can be suppressed.

Furthermore, according to the present invention, in CMP techniques for flattening STI insulating materials, pre-metal insulating materials, interlayer insulating materials, and the like, it is also possible to achieve a high degree of flattening of these insulating materials. In addition, according to the present invention, the insulating material can also be polished with few polishing scratches while achieving a sufficient polishing rate.

According to the present invention, it is possible to provide use of a polishing liquid or a polishing liquid set in a flattening step of a base substrate surface. According to the present invention, it is possible to provide use of a polishing liquid or a polishing liquid set in a flattening step of STI insulating materials, pre-metal insulating materials, or interlayer insulating materials. According to the present invention, it is possible to provide use of a polishing liquid or a polishing liquid set in a polishing step of selectively polishing an insulating material with respect to a stopper material.

DESCRIPTION OF EMBODIMENTS

Figure 1:
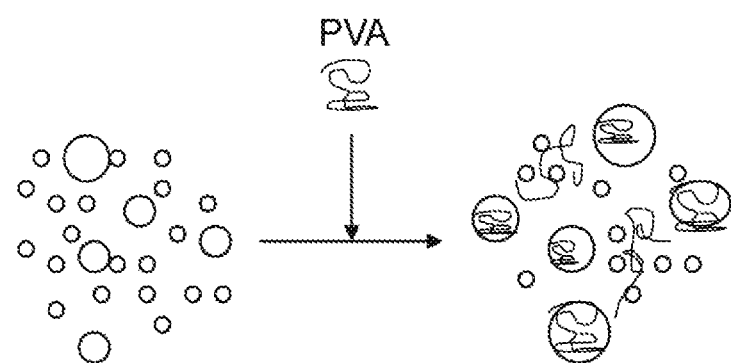
FIG. 1 is a schematic view illustrating an aggregated condition of abrasive grains when an additive is added.

Hereinafter, a polishing liquid, a polishing liquid set, and a polishing method using these of embodiments of the present invention will be described in detail.

<Definition>

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage may be replaced with the upper limit value or the lower limit value of the numerical range of another stage. In the numerical ranges that are described in the present specification, the upper limit value or the lower limit value of the numerical value range may be replaced with the value shown in the examples. "A or B" may include either one of A and B, and may also include both of A and B. Materials listed as examples in the present specification can be used singly or in combinations of two or more, unless otherwise specified. In the present specification, when a plurality of substances corresponding to each component exist in the composition, the content of each component in the composition means the total amount of the plurality of substances that exist in the composition, unless otherwise specified.

In the present specification, the term "polishing liquid" (abrasive) is defined as a composition to be brought into contact with a surface to be polished, at the time of polishing. The term "polishing liquid" itself does not limit any components contained in the polishing liquid. As described later, a polishing liquid of the present embodiment contains abrasive grains. While the abrasive grains are also referred to as "polishing particles" (abrasive particle), it is referred to as "abrasive grains" in the present specification. The abrasive grains are generally solid particles, and it is considered that a subject to be removed is removed by a mechanical action of the abrasive grains and a chemical action of the abrasive grains (mainly surfaces of the abrasive grains) at the time of polishing, but the mechanism is not limited thereto.

<Polishing Liquid>

The polishing liquid of the present embodiment is, for example, a polishing liquid for CMR The polishing liquid of the present embodiment contains abrasive grains, a hydroxy acid, a polyol, a cationic compound, and a liquid medium, in which a zeta potential of the abrasive grains is positive, and a weight average molecular weight (Mw) of the cationic compound is less than 1000.

Hereinafter, essential components and arbitrary components will be described.

(Abrasive Grains)

The polishing liquid of the present embodiment contains abrasive grains having a positive zeta potential in the polishing liquid as cationic abrasive grains. The abrasive grains preferably contain at least one selected from the group consisting of ceria, silica, alumina, zirconia, yttria, and a hydroxide of a tetravalent metal element and more preferably contain a hydroxide of a tetravalent metal element, from the viewpoint of polishing the insulating material at a further higher polishing rate. In the present specification, the "hydroxide of a tetravalent metal element" is a compound containing a tetravalent metal ($M^{4+}$) and at least one hydroxide ion ($OH^-$). The hydroxide of a tetravalent metal element may contain an anion (for example, nitrate ion $NO_3^-$ and a sulfate ion $SO_4^{2-}$) other than the hydroxide ion. For example, the hydroxide of a tetravalent metal element may contain an anion (for example, a nitrate ion $NO_3^-$ and a sulfate ion $SO_4^{2-}$) bound to the tetravalent metal element.

The abrasive grains containing the hydroxide of a tetravalent metal element has a higher reactivity with an insulating material (for example, silicon oxide) and can polish the insulating material at a further higher polishing rate, as compared with abrasive grains composed of silica, ceria, or the like. The abrasive grains can be used single or in combination of two or more kinds thereof. Examples of abrasive grains other than the abrasive grains containing the hydroxide of a tetravalent metal element include abrasive grains composed of silica, alumina, ceria, or the like. In addition, as the abrasive grains containing the hydroxide of a tetravalent metal element, composite particles of particles containing a hydroxide of a tetravalent metal element and particles containing ceria; composite particles containing a hydroxide of a tetravalent metal element and silica; and the like can also be used.

The hydroxide of a tetravalent metal element preferably contains at least one selected from the group consisting of a hydroxide of a rare-earth metal element and a hydroxide of zirconium from the viewpoint of further suppressing the generation of polishing scratches on a polished surface while polishing the insulating material at a further higher polishing rate. The hydroxide of a tetravalent metal element is more preferably a hydroxide of a rare-earth metal element from the viewpoint of further improving the polishing rate for the insulating material. As rare-earth metal elements that may adopt tetravalent forms, lanthanoids such as cerium, praseodymium, and terbium, and the like are exemplified, among them, lanthanoids are preferable, and cerium is more preferable, from the viewpoint of being further excellent in the polishing rate for the insulating material. A hydroxide of a rare-earth metal element and a hydroxide of zirconium may be used in combination, or two or more kinds can also be selected for use from hydroxides of rare-earth metal elements.

In a case where the abrasive grains contain a hydroxide of a tetravalent metal element, the lower limit of the content of the hydroxide of a tetravalent metal element is preferably 3% by mass or more, more preferably 5% by mass or more, further preferably 10% by mass or more, particularly preferably 12% by mass or more, and extremely preferably 15% by mass or more on the basis of the total abrasive grains (the total abrasive grains contained in the polishing liquid; the same also applies hereinafter), from the viewpoint of further improving the polishing rate for the insulating material. The upper limit of the content of the hydroxide of a tetravalent metal element is preferably 50% by mass or less, more preferably less than 50% by mass, further preferably 40% by mass or less, particularly preferably 30% by mass or less, and extremely preferably 20% by mass or less on the basis of the total abrasive grains, from the viewpoint of further improving the polishing rate for the insulating material.

In a case where the abrasive grains contain ceria, the lower limit of the content of ceria is preferably 50% by mass or more, more preferably more than 50% by mass, further preferably 60% by mass or more, particularly preferably 70% by mass or more, and extremely preferably 80% by mass or more on the basis of the total abrasive grains, from the viewpoint of further improving the polishing rate for the insulating material. The upper limit of the content of ceria is preferably 100% by mass or less, more preferably less than 100% by mass, further preferably 95% by mass or less, particularly preferably 90% by mass or less, and extremely preferably 85% by mass or less on the basis of the total abrasive grains, from the viewpoint of further improving the polishing rate for the insulating material. The abrasive grains preferably contain particles containing ceria and particles containing a hydroxide of a tetravalent metal element from the viewpoint of further improving the polishing rate for the insulating material.

The lower limit of the average particle diameter of the abrasive grains in the polishing liquid or a slurry of the polishing liquid set described later is preferably 20 nm or more, more preferably 30 nm or more, further preferably 40 nm or more, particularly preferably 50 nm or more, extremely preferably 100 nm or more, very preferably 120 nm or more, and even more preferably 150 nm or more, from the viewpoint of further improving the polishing rate for the insulating material. The upper limit of the average particle diameter of the abrasive grains is preferably 1000 nm or less, more preferably 800 nm or less, further preferably 600 nm or less, particularly preferably 500 nm or less, extremely preferably 400 nm or less, very preferably 300 nm or less, even more preferably 250 nm or less, and further preferably 200 nm or less, from the viewpoint of further suppressing scratches on the polished surface. From these viewpoints, the average particle diameter of the abrasive grains is more preferably 20 to 1000 nm.

The "average particle diameter" of the abrasive grains means an average secondary particle diameter of the abrasive grains. The average particle diameter of the abrasive grains can be measured, for example, for the polishing liquid or the slurry of the polishing liquid set described later, using an optical diffraction scattering particle size distribution meter (for example, trade name: N5 manufactured by Beckman Coulter, Inc. or trade name: Microtrac MT3300EXII manufactured by MicrotracBEL Corp.).

The zeta potential (surface potential) of the abrasive grains in the polishing liquid is positive (the zeta potential exceeds 0 mV) from the viewpoint of improving the polishing selectivity of the insulating material with respect to the stopper material. The lower limit of the zeta potential of the abrasive grains is preferably 10 mV or more, more preferably 20 mV or more, further preferably 25 mV or more, particularly preferably 30 mV or more, extremely preferably 40 mV or more, and very preferably 50 mV or more, from the viewpoint of further improving the polishing selectivity of the insulating material with respect to the stopper material. The upper limit of the zeta potential of the abrasive grains is not particularly limited, but is preferably 200 mV or less. From these viewpoints, the zeta potential of the abrasive grains is more preferably 10 to 200 mV.

The zeta potential of the abrasive grains can be measured, for example, by using a dynamic light scattering type zeta potential measurement apparatus (for example, trade name: DelsaNano C manufactured by Beckman Coulter, Inc.). The zeta potential of the abrasive grains can be adjusted using an additive. For example, by bringing a water-soluble polymer (polyacrylic acid or the like) into contact with abrasive grains containing ceria, abrasive grains having a negative zeta potential can be obtained.

By adjusting the content of the hydroxide of a tetravalent metal element, the chemical interaction between the abrasive grains and the surface to be polished is improved, and therefore, the polishing rate for the insulating material can be further improved. From this viewpoint, the lower limit of the content of the hydroxide of a tetravalent metal element is preferably 0.01% by mass or more, more preferably 0.02% by mass or more, and further preferably 0.03% by mass or more on the basis of the total mass of the polishing liquid. The upper limit of the content of the hydroxide of a tetravalent metal element is preferably 8% by mass or less, more preferably 5% by mass or less, further preferably 3% by mass or less, particularly preferably 1% by mass or less, extremely preferably 0.8% by mass or less, very preferably 0.5% by mass or less, even more preferably 0.3% by mass or less, further preferably 0.2% by mass or less, and particularly 0.1% by mass or less on the basis of the total mass of the polishing liquid, from the viewpoint of easily avoiding aggregation of the abrasive grains while obtaining favorable chemical interaction between the abrasive grains and the surface to be polished to effectively utilize properties of the abrasive grains. From these viewpoints, the content of the hydroxide of a tetravalent metal element is more preferably 0.01 to 8% by mass on the basis of the total mass of the polishing liquid.

The lower limit of the content of the abrasive grains is preferably 0.005% by mass or more, more preferably 0.01% by mass or more, further preferably 0.02% by mass or more, particularly preferably 0.03% by mass or more, extremely preferably 0.04% by mass or more, very preferably 0.05% by mass or more, even more preferably 0.1% by mass or more, and further preferably 0.15% by mass or more on the basis of the total mass of the polishing liquid, from the viewpoint of further improving the polishing rate for the insulating material. The upper limit of the content of the abrasive grains is preferably 20% by mass or less, more preferably 15% by mass or less, and further preferably 10% by mass or less on the basis of the total mass of the polishing liquid, from the viewpoint of enhancing the storage stability of the polishing liquid. From these viewpoints, the content of the abrasive grains is more preferably 0.005 to 20% by mass on the basis of the total mass of the abrasive grains.

Further, it is preferable that the content of the abrasive grains is further reduced from the viewpoint that the cost and polishing scratches can be further reduced. In general, when the content of the abrasive grains is reduced, the polishing rate for the insulating material or the like also tends to be reduced. On the other hand, the abrasive grains containing the hydroxide of a tetravalent metal element can obtain a predetermined polishing rate even in a smaller amount, and thus the content of the abrasive grains can be further reduced while the polishing rate and the advantage of the reduction in content of the abrasive grains are balanced. From such a viewpoint, the upper limit of the content of the abrasive grains is preferably 5% by mass or less, more preferably 4% by mass or less, further preferably 3% by mass or less, particularly preferably 1% by mass or less, extremely preferably 0.5% by mass or less, very preferably 0.3% by mass or less, and even more preferably 0.2% by mass or less on the basis of the total mass of the abrasive grains.

[Absorbance]

It is preferable that the abrasive grains contain a hydroxide of a tetravalent metal element while satisfying at least one of the following conditions (a) and (b). Incidentally, the "aqueous dispersion" having a content of the abrasive grains adjusted to a predetermined amount means a liquid containing a predetermined amount of the abrasive grains and water.

(a) The abrasive grains provide an absorbance of 1.00 or more with respect to light having a wavelength of 400 nm in an aqueous dispersion having a content of the abrasive grains adjusted to 1.0% by mass.

(b) The abrasive grains provide an absorbance of 1.000 or more with respect to light having a wavelength of 290 nm in an aqueous dispersion having a content of the abrasive grains adjusted to 0.0065% by mass.

Regarding the condition (a), by using the abrasive grains that provide an absorbance of 1.00 or more with respect to light having a wavelength of 400 nm in an aqueous dispersion having a content of the abrasive grains adjusted to 1.0% by mass, the polishing rate can be further improved. The reason for this is not necessarily clear, but it is considered by the present inventor as follows. That is, it is considered that particles including $M(OH)_a X_b$ (in the formula, a+b×c=4) made of a tetravalent metal ($M^{4+}$), one to three hydroxide ions ($OH^-$), and one to three anions ($X^{c-}$) are generated as part of the abrasive grains (incidentally, such particles are also the "abrasive grains containing the hydroxide of a tetravalent metal element") depending on production conditions of the hydroxide of a tetravalent metal element and the like. It is considered that, in $M(OH)_a X_b$, an electron-withdrawing anion ($X^{c-}$) acts to enhance reactivity of the hydroxide ion and the polishing rate is improved with the increase in abundance of $M(OH)_a X_b$. Then, it is considered that the particles including $M(OH)_a X_b$ absorb light having a wavelength of 400 nm, and thus, the polishing rate is improved as the abundance of $M(OH)_a X_b$ increases and the absorbance with respect to light having a wavelength of 400 nm becomes higher.

It is considered that the abrasive grains containing a hydroxide of a tetravalent metal element can contain not only $M(OH)_a X_b$ but also $M(OH)_4$, $MO_2$, or the like. Examples of the anions ($X^{c-}$) include $NO_3^-$ and $SO_4^{2-}$.

Incidentally, the containing of $M(OH)_a X_b$ in the abrasive grains containing a hydroxide of a tetravalent metal element can be confirmed by a method for detecting a peak corresponding to the anions ($X^{c-}$) with FT-IR AIR method (Fourier transform Infra Red Spectrometer Attenuated Total Reflection method) after washing the abrasive grains with pure water well. The existence of the anions ($X^{c-}$) can also be confirmed by XPS method (X-ray Photoelectron Spectroscopy).

Here, the absorption peak of $M(OH)_a X_b$ (for example, $M(OH)_3 X$) at a wavelength of 400 nm has been confirmed to be much smaller than the absorption peak at a wavelength of 290 nm described below. In this regard, the present inventors have studied the magnitude of absorbance using an aqueous dispersion having an abrasive grain content of 1.0% by mass, which has a relatively high abrasive grain content and whose absorbance is easily detected to a greater degree, and as a result, found that a polishing rate improving effect is excellent in the case of using abrasive grains which provide an absorbance of 1.00 or more with respect to light having a wavelength of 400 nm in the aqueous dispersion.

The lower limit of the absorbance with respect to light having a wavelength of 400 nm is preferably 1.50 or more, more preferably 1.55 or more, and further preferably 1.60 or more, from the viewpoint of easily polishing an insulating material at a further excellent polishing rate.

Regarding the condition (b), by using the abrasive grains which provide an absorbance of 1.000 or more with respect to light having a wavelength of 290 nm in the aqueous dispersion having a content of the abrasive grains adjusted to 0.0065% by mass, a polishing rate can be further improved. The reason for this is not necessarily clear, but the present inventors consider as follows. That is, particles containing $M(OH)_a X_b$ (for example, $M(OH)_3 X$) which are generated depending on producing conditions of the hydroxide of a tetravalent metal element and the like have a calculated absorption peak at a wavelength of about 290 nm, for example, particles composed of $Ce^{4+}(OH^-)_3NO_3^-$ have an absorption peak at a wavelength of 290 nm. Thus, it is considered that, as the abundance of $M(OH)_aX_b$ is increased and the absorbance with respect to light having a wavelength of 290 nm is increased, the polishing rate is improved.

Here, the absorbance with respect to light having a wavelength of about 290 nm tends to be detected to a greater degree as the measuring limit is exceeded. In this regard, the present inventors have studied the magnitude of absorbance using an aqueous dispersion having an abrasive grain content of 0.0065% by mass, which has a relatively low abrasive grain content and whose absorbance is easily detected to a small degree, and as a result, found that a polishing rate improving effect is excellent in the case of using abrasive grains which provide an absorbance of 1.000 or more with respect to light having a wavelength of 290 nm in the aqueous dispersion.

The lower limit of the absorbance with respect to light having a wavelength of 290 nm is more preferably 1.050 or more, further preferably 1.100 or more, particularly preferably 1.130 or more, and extremely preferably 1.150 or more, from the viewpoint of polishing an insulating material at a further excellent polishing rate. The upper limit of the absorbance with respect to light having a wavelength of 290 nm is not particularly limited, but for example, is preferably 10.00 or less.

In a case where the abrasive grains which provide an absorbance of 1.00 or more with respect to light having a wavelength of 400 nm provide an absorbance of 1.000 or more with respect to light having a wavelength of 290 nm in the aqueous dispersion having a content of the abrasive grains adjusted to 0.0065% by mass, an insulating material can be polished at a further excellent polishing rate.

Further, the hydroxide of a tetravalent metal element (for example, $M(OH)_aX_b$) tends not to have light absorption with respect to light having a wavelength of 450 nm or more (particularly, a wavelength of 450 to 600 nm). Therefore, from the viewpoint of suppressing adverse impacts on polishing due to impurities being contained and polishing an insulating material at a further excellent polishing rate, the abrasive grains preferably provide an absorbance of 0.010 or less with respect to light having a wavelength of 450 to 600 nm in the aqueous dispersion having a content of the abrasive grains adjusted to 0.0065% by mass (65 ppm). That is, it is preferable that the absorbance with respect to all of light within a range of a wavelength of 450 to 600 nm does not exceed 0.010 in the aqueous dispersion having a content of the abrasive grains adjusted to 0.0065% by mass. The upper limit of the absorbance with respect to light having a wavelength of 450 to 600 nm is more preferably less than 0.010. The lower limit of the absorbance with respect to light having a wavelength of 450 to 600 nm is preferably 0.

The absorbance in the aqueous dispersion can be measured, for example, using a spectrophotometer (device name: U3310) manufactured by Hitachi, Ltd. Specifically, an aqueous dispersion having a content of the abrasive grains adjusted to 1.0% by mass or 0.0065% by mass is prepared as a measuring sample. About 4 mL of this measuring sample is poured into a 1-cm square cell, and the cell is placed in the device. Next, absorbance measurement is performed within a range of a wavelength of 200 to 600 nm, and the absorbance is determined from the obtained chart.

[Light Transmittance]

The polishing liquid of the present embodiment preferably has a high transparency with respect to visible light (it is visually transparent or nearly transparent). Specifically, the abrasive grains contained in the polishing liquid of the present embodiment preferably provide a light transmittance of 50%/cm or more with respect to light having a wavelength of 500 nm in an aqueous dispersion having a content of the abrasive grains adjusted to 1.0% by mass. This makes it possible to further suppress a reduction in the polishing rate due to the addition of an additive, and thus, it becomes easier to obtain other properties while keeping the polishing rate. From this viewpoint, the lower limit of the light transmittance is more preferably 60%/cm or more, further preferably 70%/cm or more, particularly preferably 80%/cm or more, extremely preferably 90%/cm or more, and very preferably 92%/cm or more. The upper limit of the light transmittance is 100%/cm.

The reason why the reduction in the polishing rate can be suppressed by adjusting the light transmittance of the abrasive grains in this manner is not understood in detail, but the present inventors consider as follows. In the abrasive grains containing the hydroxide of a tetravalent metal element (cerium or the like), it is considered that the chemical action is more dominant than the mechanical action. Therefore, the number of the abrasive grains is considered to contribute to the polishing rate more than the size of the abrasive grains.

In a case where the light transmittance is low in an aqueous dispersion having a content of the abrasive grains of 1.0% by mass, it is considered that, in the abrasive grains present in the aqueous dispersion, particles having a large particle diameter (hereinafter, referred to as "coarse particles") exist in relatively large numbers. When an additive (for example, polyvinyl alcohol (PVA)) is added to a polishing liquid containing such abrasive grains, as illustrated in FIG. 1, other particles aggregate around the coarse particles as nuclei. It is considered that, as a result, the number of the abrasive grains which act on a surface to be polished per unit area (effective abrasive grain number) is reduced and the specific surface area of the abrasive grains which contact the surface to be polished is reduced, and thus, the reduction in the polishing rate occurs.

Figure 2:
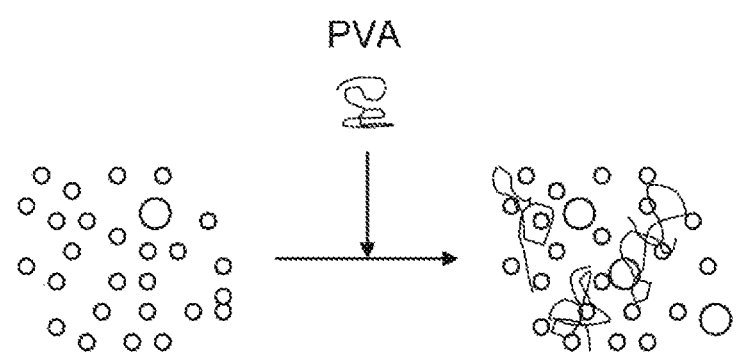
FIG. 2 is a schematic view illustrating an aggregated condition of abrasive grains when an additive is added.

On the other hand, in a case where the light transmittance is high in an aqueous dispersion having a content of the abrasive grains of 1.0% by mass, it is considered that the abrasive grains present in the aqueous dispersion are in a state where the "coarse particles" are small in number. In a case where the abundance of the coarse particles is low in this manner, as illustrated in FIG. 2, even when an additive (for example, polyvinyl alcohol) is added to a polishing liquid, since the coarse particles which are to be nuclei for aggregation are small in number, aggregation between abrasive grains is suppressed or the size of aggregated particles becomes smaller compared with the aggregated particles illustrated in FIG. 1. It is considered that, as a result, the number of the abrasive grains which act on a surface to be polished per unit area (effective abrasive grain number) is maintained and the specific surface area of the abrasive grains which contact the surface to be polished is maintained, and thus, the reduction in the polishing rate becomes difficult to occur.

According to the study by the present inventors, it has been found that, even among polishing liquids in which particle diameters measured by a common particle diameter measurement apparatus are the same, some may be visually transparent (high light transmittance) and some may be visually turbid (low light transmittance). From this, it is considered that the coarse particles which can produce the action described above contribute to the reduction in the polishing rate even by a very slight amount which cannot be detected by a common particle diameter measurement apparatus.

Further, it has been found that, even if filtration is repeated multiple times to reduce the coarse particles, a phenomenon of reducing the polishing rate due to an additive is not significantly improved, and in some cases, the above-described polishing rate improving effect due to absorbance is not sufficiently exhibited. In this regard, the present inventors have found that the above-described problem can be solved by using abrasive grains having a high light transmittance in an aqueous dispersion, by devising a producing method of the abrasive grains or the like.

The light transmittance is transmittance with respect to light having a wavelength of 500 nm. The light transmittance can be measured by a spectrophotometer. Specifically, it can be measured, for example, by a spectrophotometer U3310 (device name) manufactured by Hitachi, Ltd.

As a more specific measuring method, an aqueous dispersion having a content of the abrasive grains adjusted to 1.0% by mass is prepared as a measuring sample. About 4 mL of this measuring sample is poured into a 1-cm square cell, and measurement is performed after the cell is placed in the device.

The absorbance and light transmittance which the abrasive grains contained in the polishing liquid produce in the aqueous dispersion can be measured by removing solid components other than the abrasive grains and liquid components other than water, then preparing an aqueous dispersion having a predetermined abrasive grain content, and using this aqueous dispersion. For removing the solid components or the liquid components, although varying depending on components contained in the polishing liquid, for example, centrifugation methods such as centrifugation using a centrifuge capable of applying gravitational acceleration of several thousand G or less and ultracentrifugation using an ultracentrifuge capable of applying gravitational acceleration of several tens of thousands G or more; chromatography methods such as partition chromatography, adsorption chromatography, gel permeation chromatography, and ion-exchange chromatography; filtration methods such as natural filtration, filtration under reduced pressure, pressure filtration, and ultrafiltration; distillation methods such as distillation under reduced pressure and atmospheric distillation; and the like can be used, or these may be combined as appropriate.

For example, in the case of containing a compound having a weight average molecular weight of several tens of thousands or more (for example, 50000 or more), as a method for separating the abrasive grains, chromatography methods, filtration methods, and the like are exemplified, and among them, at least one selected from the group consisting of gel permeation chromatography and ultrafiltration is preferable. In the case of using filtration methods, the abrasive grains contained in the polishing liquid can be made to pass through a filter by setting appropriate conditions. In the case of containing a compound having a weight average molecular weight of several tens of thousands or less (for example, less than 50000), as a method for separating the abrasive grains, chromatography methods, filtration methods, distillation methods, and the like are exemplified, and at least one selected from the group consisting of gel permeation chromatography, ultrafiltration, and distillation under reduced pressure is preferable. In the case of containing a plurality of kinds of abrasive grains, as a method for separating the abrasive grains, filtration methods, centrifugation methods, and the like are exemplified, and much abrasive grains containing the hydroxide of a tetravalent metal element are contained in the filtrate in the case of filtration and in a liquid phase in the case of centrifugation.

As a method for separating the abrasive grains by chromatography methods, for example, the abrasive grain component can be fractionated and/or other components can be fractionated by the following conditions.

Sample solution: polishing liquid 100 μL
Detector: UV-VIS Detector manufactured by Hitachi, Ltd., trade name "L-4200"
Wavelength: 400 nm
Integrator: GPC Integrator manufactured by Hitachi, Ltd., trade name "D-2500"
Pump: trade name "L-7100" manufactured by Hitachi, Ltd.
Column: packing column for water-based HPLC manufactured by Hitachi Chemical Co., Ltd., trade name "GL-W550S"
Eluent: deionized water
Measurement temperature: 23° C.
Flow rate: 1 mL/min (pressure is about 40 to 50 kg/cm$^2$)
Measurement time: 60 min The abrasive grain component may not be able to be fractionated under the above-described conditions depending on components contained in the polishing liquid, and in this case, it can be separated by optimizing the amount of a sample solution, the kind of a column, the kind of an eluent, a measurement temperature, a flow rate, and the like. Further, it may be separated from the abrasive grains by adjusting the pH of the polishing liquid to adjust distillation time of the components contained in the polishing liquid. In a case where the polishing liquid contains insoluble components, the insoluble components are preferably removed by filtration, centrifugation, or the like, as necessary.

[Preparation Method for Hydroxide of Tetravalent Metal Element]

The hydroxide of a tetravalent metal element can be prepared by reacting a salt of a tetravalent metal element (metal salt) with an alkali source (base). The hydroxide of a tetravalent metal element is preferably prepared by mixing a salt of a tetravalent metal element with an alkali liquid (for example, alkali aqueous solution). This makes it possible to obtain particles having an extremely fine particle diameter, and obtain a polishing liquid which is further excellent in a polishing scratch reducing effect. Such methods are disclosed, for example, in Patent Literatures 6 and 7. The hydroxide of a tetravalent metal element can be obtained by mixing a metal salt solution of a salt of a tetravalent metal element (for example, metal salt aqueous solution) with alkali liquid. As the salt of a tetravalent metal element, those which are conventionally known can be used without limitation, and examples thereof include $M(NO_3)_4$, $M(SO_4)_2$, $M(NH_4)_2(NO_3)_6$, $M(NH_4)_4(SO_4)_4$ (M represents a rare-earth metal element), and $Zr(SO_4)_2 \cdot 4H_2O$. Cerium (Ce) which is chemically active is preferable for M.

(Additive)

The polishing liquid of the present embodiment contains an additive. Here, "additive" refers to a substance that is contained in the polishing liquid in addition to the liquid medium and the abrasive grains, in order to adjust the polishing properties such as polishing rate and polishing selectivity; polishing liquid properties such as dispersibility of the abrasive grains and storage stability; and the like.

[Hydroxy Acid]

The polishing liquid of the present embodiment contains a hydroxy acid as an essential additive. The hydroxy acid has an effect of suppressing an excessive increase in the polishing rate for the stopper material (for example, silicon nitride and polysilicon) (the effect as a polishing retarder). Further, by using the hydroxy acid, polishing of the insulating material (for example, silicon oxide) after exposing of a stopper is suppressed, thereby allowing high flatness to be obtained. This is speculated that a functional group (a carboxyl group, a hydroxyl group, or the like) of the hydroxy acid adsorbs to the insulating material and the stopper to cover these, and thus, progress of polishing by the abrasive grains is moderated and an excessive increase in the polishing rate is suppressed.

Examples of the hydroxy acid include glycolic acid, glyceric acid, lactic acid, 2,2-bis(hydroxymethyl)propionic acid, 2,2-bis(hydroxymethyl)butyric acid, bicin, tricine, tyrosine, serine, and threonine. As the hydroxy acid, an aliphatic hydroxy acid is preferably used from the viewpoint of further improving the polishing selectivity of the insulating material with respect to the stopper material.

The hydroxy acid is preferably monocarboxylic acid and more preferably saturated monocarboxylic acid. According to this, aggregation of the abrasive grains does not occur when the cationic abrasive grains and the hydroxy acid are concurrently used (while keeping dispersion stability) and the functional group (a carboxyl group, a hydroxyl group, or the like) of the hydroxy acid suitably protects the stopper, and thus, the insulating material can be polished at a high polishing rate and the polishing rate for the stopper material can be sufficiently suppressed.

The hydroxy acid can be used singly or in combination of two or more kinds thereof for the purposes of adjusting polishing properties such as polishing selectivity and flatness, and the like.

The upper limit of the hydroxyl value of the hydroxy acid is preferably 1500 or less, more preferably 1300 or less, further preferably 1100 or less, and particularly preferably 1000 or less, from the viewpoint of easily obtaining excellent dispersibility of the abrasive grains. The lower limit of the hydroxyl value of the hydroxy acid is preferably 50 or more, more preferably 150 or more, further preferably 250 or more, particularly preferably 500 or more, extremely preferably 600 or more, very preferably 700 or more, and even more preferably 800 or more, from the viewpoint of further improving the polishing selectivity of the insulating material with respect to the stopper material and flatness. From these viewpoints, the hydroxyl value of the hydroxy acid is more preferably 50 to 1500. Incidentally, the "hydroxyl value" is a numerical value as an indicator of the size of the number of hydroxyl groups contained in the hydroxy acid and is calculated from the following Formula (1).

$$\text{Hydroxyl value} = 56110 \times \text{number of hydroxyl groups} / \text{molecular weight} \quad (1)$$

The lower limit of the content of the hydroxy acid is preferably 0.01% by mass or more, more preferably 0.03% by mass or more, further preferably 0.05% by mass or more, and particularly preferably 0.1% by mass or more on the basis of the total mass of the polishing liquid, from the viewpoint of further improving the polishing selectivity of the insulating material with respect to the stopper material and flatness. The upper limit of the content of the hydroxy acid is preferably 1.0% by mass or less, more preferably 0.8% by mass or less, further preferably 0.5% by mass or less, particularly preferably 0.4% by mass or less, and extremely preferably 0.3% by mass or less on the basis of the total mass of the polishing liquid, from the viewpoint of easily obtaining an appropriate polishing rate for the insulating material. From these viewpoints, the content of the hydroxy acid is more preferably 0.01 to 1.0% by mass. Incidentally, in the case of using a plurality of compounds as the hydroxy acid, it is preferable that the total of the contents of the respective compounds satisfy the above range.

[Polyol]

The polishing liquid of the present embodiment contains a polyol (excluding a compound corresponding to a hydroxy acid) as an essential additive. The polyol is a compound having two or more hydroxy groups in the molecule. The polyol is speculated to have an action that forms a protective layer on the insulating material (for example, silicon oxide) and enables the insulating material to be polished at an appropriate rate. Further, by using the polyol, the polishing of the insulating material after exposing of the stopper is suppressed so that high flatness can be obtained. This is speculated that, by a hydrophilic portion of the polyol being adsorbed and coated to the insulating material, progress of polishing by the abrasive grains is moderated and an excessive increase in the polishing rate is suppressed.

Examples of the polyol include polyglycerin, polyvinyl alcohol, polyalkylene glycol, polyoxyalkylene glycol, polyoxyalkylene sorbitol ether (polyoxypropylene sorbitol ether or the like), a polyoxyalkylene condensate of ethylenediamine (ethylene diamine tetrapolyoxyethylene polyoxypropylene or the like), 2,2-bis(4-polyoxyalkylene-oxyphenyl)propane, polyoxyalkylene glyceryl ether, polyoxyalkylene diglyceryl ether, polyoxyalkylene trimethylolpropane ether, polyoxyalkylene pentaerythritol ether, and polyoxyalkylene methyl glucoside.

The polyol preferably contains at least one selected from the group consisting of polyglycerin, polyoxyalkylene glycol, polyoxyalkylene sorbitol ether, a polyoxyalkylene condensate of ethylenediamine, polyoxyalkylene glyceryl ether, polyoxyalkylene trimethylolpropane ether, and polyoxyalkylene pentaerythritol ether, and more preferably contains at least one selected from the group consisting of polyoxyalkylene sorbitol ether, a polyoxyalkylene condensate of ethylenediamine, and polyoxyalkylene trimethylolpropane ether, from the viewpoint of easily improving the polishing selectivity of the insulating material with respect to the stopper material. The polyol preferably contains a polyol not having an aromatic group from the viewpoint of easily improving the polishing selectivity of the insulating material with respect to the stopper material.

The polyol is preferably polyether polyol (a polyol having a polyether structure) from the viewpoint that it is easy to form a protective layer on a surface to be polished to moderately adjust the polishing rate, and thus, excessive polishing of the concave portion is easily suppressed, and therefore, it is easy to flatly finish a wafer after polishing.

The polyether polyol preferably has a polyoxyalkylene structure. According to this, it is easier to form a protective layer on a surface to be polished to moderately adjust the polishing rate, and thus, excessive polishing of the concave portion is more easily suppressed, and therefore, it is easier to flatly finish a wafer after polishing. The number of carbon atoms of the oxyalkylene group (structural unit) in the polyoxyalkylene structure is preferably 1 or more, and more preferably 2 or more, from the viewpoint of easily improving the polishing selectivity of the insulating material with respect to the stopper material. The number of carbon atoms of the oxyalkylene group (structural unit) in the polyoxyalkylene structure is preferably 5 or less, more preferably 4 or less, and further preferably 3 or less, from the viewpoint of easily improving the polishing selectivity of the insulating material with respect to the stopper material. From these viewpoints, the number of carbon atoms is more preferably 1 to 5. The polyoxyalkylene chain may be a homopolymer chain and it may be a copolymer chain. The copolymer chain may be a block polymer chain and it may be a random polymer chain.

The polyol can be used singly or in combination of two or more kinds thereof for the purposes of adjusting polishing properties such as flatness.

The lower limit of the content of the polyol is preferably 0.05% by mass or more, more preferably 0.1% by mass or more, further preferably 0.2% by mass or more, particularly preferably 0.3% by mass or more, extremely preferably 0.4% by mass or more, and very preferably 0.5% by mass or more on the basis of the total mass of the polishing liquid, from the viewpoint of further improving the polishing selectivity of the insulating material with respect to the stopper material and flatness. The upper limit of the content of the polyol is preferably 5.0% by mass or less, more preferably 3.0% by mass or less, further preferably 2.0% by mass or less, and particularly preferably 1.0% by mass or less on the basis of the total mass of the polishing liquid, from the viewpoint of easily obtaining an appropriate polishing rate for the insulating material. From these viewpoints, the content of the polyol is more preferably 0.05 to 5.0% by mass. Incidentally, in the case of using a plurality of compounds as the polyol, it is preferable that the total of the contents of the respective compounds satisfy the above range.

[Cationic Compound]

The polishing liquid of the present embodiment contains a cationic compound (excluding a compound corresponding to a hydroxy acid or a polyol) as an essential additive. The cationic compound is a compound having a cation group in the molecule. Examples of the cation group include an amino group (a functional group in which a hydrogen atom is removed from ammonia, primary amine or secondary amine), an ammonium group (primary, secondary, tertiary, or quaternary ammonium group), an imino group, and a cyano group.

The cationic compound has an effect of suppressing an excessive increase in the polishing rate for the stopper material (for example, silicon nitride and polysilicon) (the effect as a polishing retarder). Further, by using the cationic compound, polishing of the insulating material (for example, silicon oxide) after exposing of a stopper is suppressed, thereby allowing high flatness to be obtained. This is speculated that, with an electrostatic action as a main factor, a cation group (a cation group as a polar group, or the like) of the cationic compound adsorbs to the insulating material and the stopper to cover these, and thus, progress of polishing by the abrasive grains of a positive charge is moderated and an excessive increase in the polishing rate is suppressed.

Examples of the cationic compound include lauryl trimethyl ammonium chloride, trimethyl-2-methacryloyloxyethyl ammonium chloride, and 3-(methacryloylamino)propyl trimethylammonium chloride. As the cationic compound, a cationic monomer can be used.

Examples of counter anions in the cationic compound include halide ions such as chlorine ion and bromine ion; alkyl sulfate ions such as methyl sulfate ion and ethyl sulfate ion; nitrate ion; and hydroxide ions. As the counter anion, chlorine ion (Cl$^-$) is preferable from the viewpoint of further improving the polishing selectivity of the insulating material with respect to the stopper material and the viewpoint of being excellent in general versatility.

The cationic compound can be used singly or in combination of two or more kinds thereof for the purposes of adjusting polishing properties such as polishing selectivity and flatness.

The upper limit of the weight average molecular weight of the cationic compound is less than 1000 from the viewpoint that the polishing selectivity of the insulating material with respect to the stopper material is improved by polishing the insulating material (silicon oxide or the like) at an appropriate polishing rate and sufficiently suppressing the polishing rate for the stopper material (for example, silicon nitride and polysilicon). The upper limit of the weight average molecular weight of the cationic compound is preferably 800 or less, more preferably 600 or less, further preferably 400 or less, and particularly preferably 300 or less, from the viewpoint of easily improving the polishing selectivity of the insulating material with respect to the stopper material. The lower limit of the weight average molecular weight of the cationic compound is not particularly limited, but is preferably 100 or more, more preferably 150 or more, and further preferably 200 or more, from the viewpoint of being excellent in ease of handling. From these viewpoints, the weight average molecular weight of the cationic compound is more preferably 100 or more and less than 1000.

Incidentally, the weight average molecular weight can be measured, for example, by a gel permeation chromatography method (GPC) under the following conditions using a calibration curve of standard polystyrene.

Instrument used: Hitachi L-6000 Model [manufactured by Hitachi, Ltd.]

Column: Gel-Pak GL-R420+Gel-Pak GL-R430+Gel-Pak GL-R440 [manufactured by Hitachi Chemical Company, Ltd., trade names, three columns in total]

Eluent: tetrahydrofuran

Measurement temperature: 40° C.

Flow rate: 1.75 mL/min

Detector: L-3300RI [manufactured by Hitachi, Ltd.]

The lower limit of the content of the cationic compound is preferably 0.0001% by mass or more, more preferably 0.0005% by mass or more, further preferably 0.0008% by mass or more, particularly preferably 0.001% by mass or more, extremely preferably 0.002% by mass or more, very preferably 0.003% by mass or more, even more preferably 0.005% by mass or more, and further preferably 0.006% by mass or more on the basis of the total mass of the polishing liquid, from the viewpoint of further improving the polishing selectivity of the insulating material with respect to the stopper material and flatness. The upper limit of the content of the cationic compound is preferably 0.1% by mass or less, more preferably 0.08% by mass or less, further preferably 0.05% by mass or less, particularly preferably 0.03% by mass or less, and extremely preferably 0.01% by mass or less on the basis of the total mass of the polishing liquid, from the viewpoint of easily obtaining an appropriate polishing rate for the insulating material. From these viewpoints, the content of the cationic compound is more preferably 0.0001 to 0.1% by mass and further preferably 0.001 to 0.1% by mass on the basis of the total mass of the polishing liquid. Incidentally, in the case of using a plurality of compounds as the cationic compound, it is preferable that the total of the contents of the respective compounds satisfy the above range.

[Arbitrary Additive]

The polishing liquid of the present embodiment may further contain an arbitrary additive (excluding compound corresponding to the hydroxy acid, the polyol, or the cationic compound). Examples of the arbitrary additive include amino acids, water-soluble polymers, and oxidants (for example, hydrogen peroxide). Each of these additives can be used singly or in combination of two or more kinds thereof.

The amino acid has the effect of stabilizing the pH of the polishing liquid and the effect of improving the dispersibility of abrasive grains (for example, abrasive grains containing a hydroxide of a tetravalent metal element) to further improve the polishing rate for the insulating material. Examples of the amino acid include arginine, lysine, aspartic acid, glutamic acid, asparagine, glutamine, histidine, proline, tryptophan, glycine, α-alanine, β-alanine, methionine, cysteine, phenylalanine, leucine, valine, isoleucine, glycylglycine, and glycylalanine.

The water-soluble polymer has the effect of adjusting polishing properties such as flatness, in-plane uniformity, the polishing selectivity of silicon oxide with respect to silicon nitride (the polishing rate for silicon oxide/the polishing rate for silicon nitride), and the polishing selectivity of silicon oxide with respect to polysilicon (the polishing rate for silicon oxide/the polishing rate for polysilicon). Here, the "water-soluble polymer" is defined as a polymer which is dissolved in 100 g of water in an amount of 0.1 g or more.

The water-soluble polymer is not particularly limited, and examples thereof include polyacrylic acid-based polymers such as polyacrylic acid, a polyacrylic acid copolymer, polyacrylate, and a polyacrylic acid copolymer salt; polymethacrylic acid-based polymers such as polymethacrylic acid and polymethacrylate; polyacrylamide; polydimethylacrylamide; polysaccharides such as alginic acid, pectinic acid, carboxymethylcellulose, agar, curdlan, dextrin, cyclodextrin, and pullulan; vinyl-based polymers such as polyvinyl alcohol, polyvinylpyrrolidone, and polyacrolein; glycerin-based polymers such as polyglycerin and polyglycerin derivatives; and polyethyleneglycol. The water-soluble polymer can be used singly or in combination of two or more kinds thereof.

In the case of using an amino acid or an oxidant, the content thereof is preferably 0.0001 to 10% by mass on the basis of the total mass of the polishing liquid, from the viewpoint of obtaining the addition effect of the additive while suppressing precipitation of the abrasive grains. Incidentally, in the case of using a plurality of compounds as each of these additives, it is preferable that the total of the contents of the respective compounds satisfy the above range.

In the case of using a water-soluble polymer, the lower limit of the content of the water-soluble polymer is preferably 0.0001% by mass or more, more preferably 0.001% by mass or more, further preferably 0.01% by mass or more on the basis of the total mass of the polishing liquid, from the viewpoint of obtaining the addition effect of the water-soluble polymer while suppressing precipitation of the abrasive grains. The upper limit of the content of the water-soluble polymer is preferably 10% by mass or less, more preferably 5% by mass or less, further preferably 1% by mass or less, and particularly preferably 0.5% by mass or less on the basis of the total mass of the polishing liquid, from the viewpoint of obtaining the addition effect of the water-soluble polymer while suppressing precipitation of the abrasive grains. In the case of using a plurality of compounds as the water-soluble polymer, it is preferable that the total of the contents of the respective compounds satisfy the above range.

(Liquid Medium)

The liquid medium in the polishing liquid of the present embodiment is not particularly limited, but is preferably water such as deionized water or ultrapure water. The content of the liquid medium may correspond to the amount of the remaining polishing liquid from which the contents of other constituent components are removed, and is not particularly limited.

(Properties of Polishing Liquid)

The lower limit of the pH of the polishing liquid of the present embodiment is preferably 2.0 or more, more preferably 2.5 or more, further preferably 3.0 or more, particularly preferably 3.2 or more, extremely preferably 3.5 or more, and very preferably 4.0 or more, from the viewpoint of further improving the polishing rate for the insulating material. The upper limit of the pH is preferably 7.0 or less, more preferably 6.5 or less, further preferably 6.0 or less, and particularly preferably 5.0 or less, from the viewpoint of further improving an effect of suppressing polishing of a stopper material. The pH of the polishing liquid is more preferably 2.0 to 7.0 from the viewpoint of being further excellent in the storage stability of the polishing liquid and an effect of suppressing polishing of a stopper material. The pH of the polishing liquid is defined as the pH at a liquid temperature of 25° C.

The pH of the polishing liquid can be adjusted by an acid component such as an inorganic acid or an organic acid; an alkali component such as ammonia, sodium hydroxide, tetramethylammonium hydroxide (TMAH), imidazole, or alkanolamine; and the like. Further, in order to stabilize the pH, a buffer may be added. In addition, a buffer solution (buffer-containing liquid) may be added as the buffer. Examples of such a buffer solution include an acetate buffer solution and a phthalate buffer solution.

The pH of the polishing liquid of the present embodiment can be measured by a pH meter (for example, Model No. PHL-40 manufactured by DKK-TOA CORPORATION). Specifically, for example, after performing 2-point calibration of the pH meter using a phthalate pH buffer solution (pH: 4.01) and a neutral phosphate pH buffer solution (pH: 6.86) as a standard buffer solution, an electrode of the pH meter is placed in the polishing liquid for 2 minutes or longer, and the value after stabilization is measured. Both the liquid temperatures of the standard buffer solution and the polishing liquid are set to 25° C.

The polishing liquid of the present embodiment may be stored as a one-pack type polishing liquid containing at least abrasive grains, a hydroxy acid, a polyol, a cationic compound, and a liquid medium, or as a multi-pack type (for example, two-pack type) polishing liquid set containing constituent components of the polishing liquid divided into a slurry (first liquid) and an additive liquid (second liquid) such that the slurry and additive liquid are mixed to form the polishing liquid. The slurry contains, for example, at least abrasive grains and a liquid medium. The additive liquid contains, for example, at least a hydroxy acid, a polyol, a cationic compound, and a liquid medium. Between the slurry and the additive liquid, the hydroxy acid, the polyol, the cationic compound, an arbitrary additive, and the buffer are preferably contained in the additive liquid. Incidentally, the constituent components of the polishing liquid may be stored as a polishing liquid set divided into three or more liquids.

In the polishing liquid set, the slurry and the additive liquid are mixed immediately before polishing or during polishing to prepare the polishing liquid. Further, a one-pack type polishing liquid may be stored as a stock solution for a polishing liquid with a reduced liquid medium content and used by dilution with a liquid medium at the time of polishing. A multi-pack type polishing liquid set may be stored as a stock solution for a slurry and a stock solution for an additive liquid with reduced liquid medium contents, and used by dilution with a liquid medium at the time of polishing.

In the case of a one-pack type polishing liquid, as a method of supplying the polishing liquid onto a polishing platen, a method of supplying the polishing liquid by direct liquid conveyance; a method of conveying the stock solution for the polishing liquid and the liquid medium through separate tubings, merging them to mix, and then supplying; a method of mixing the stock solution for a polishing liquid and the liquid medium in advance and then supplying; and the like can be used.

In the case of storage as a multi-pack type polishing liquid set divided into a slurry and an additive liquid, the polishing rate can be adjusted by arbitrarily changing the composition of these liquids. In the case of performing polishing using a polishing liquid set, as a method of supplying the polishing liquid onto the polishing platen, the following method is mentioned. For example, a method of conveying the slurry and the additive liquid through separate tubings, merging these tubings to mix, and then supplying; a method of conveying the stock solution for a slurry, the stock solution for an additive liquid, and the liquid medium through separate tubings, merging them to mix, and then supplying; a method of mixing the slurry and the additive liquid in advance and supplying; a method of mixing the stock solution for a slurry, the stock solution for an additive liquid, and the liquid medium in advance and the supplying; and the like can be used. Further, a method of respectively supplying the slurry and the additive liquid of the polishing liquid set onto the polishing platen can also be used. In this case, the polishing liquid obtained by mixing the slurry and the additive liquid on the polishing platen is used for polishing the surface to be polished.

Incidentally, the polishing liquid set of the present embodiment may be an aspect in which the polishing liquid containing at least the above-described essential component and the additive liquid containing at least an arbitrary component such as an oxidant (for example, hydrogen peroxide) are separated. In this case, a liquid mixture (the liquid mixture also corresponds to "polishing liquid") obtained by mixing the polishing liquid and the additive liquid is used to perform polishing. Further, the polishing liquid set of the present embodiment may be an aspect in which a liquid containing at least a part of the above-described essential component, a liquid containing at least the remainder of the above-described essential component, and the additive liquid containing at least an arbitrary component are separated as the polishing liquid set separated into three or more liquids. Each of the liquids constituting the polishing liquid set may be stored as the stock solution with a reduced content of the liquid medium.

<Polishing Method>

The polishing method of the present embodiment (a polishing method for a base substrate, or the like) may include a polishing step of polishing a surface to be polished (a surface to be polished of the base substrate, or the like) by using the one-pack type polishing liquid or a polishing step of polishing a surface to be polished (a surface to be polished of the base substrate, or the like) by using a polishing liquid obtained by mixing the slurry and the additive liquid of the polishing liquid set.

The polishing method of the present embodiment may be a polishing method for a base substrate having an insulating material and silicon nitride, and may include, for example, a polishing step of selectively polishing the insulating material with respect to silicon nitride by using the one-pack type polishing liquid or a polishing liquid obtained by mixing the slurry and the additive liquid of the polishing liquid set. In this case, the base substrate may have, for example, a member containing an insulating material and a member containing silicon nitride.

Further, the polishing method of the present embodiment may be a polishing method for a base substrate having an insulating material and polysilicon, and may include, for example, a polishing step of selectively polishing the insulating material with respect to polysilicon by using the one-pack type polishing liquid or a polishing liquid obtained by mixing the slurry and the additive liquid of the polishing liquid set. In this case, the base substrate may have, for example, a member containing an insulating material and a member containing polysilicon.

The expression "selectively polishing a material A with respect to a material B" means that the polishing rate for the material A is higher than the polishing rate for the material B under the same conditions. More specifically, the above expression means, for example, that the material A is polished with a polishing rate ratio of the polishing rate for the material A to the polishing rate for the material B being 20 or more (preferably 80 or more).

In the polishing step, for example, in a state where the material to be polished of the base substrate that has the material to be polished is pressed against a polishing pad (polishing cloth) of a polishing platen, the polishing liquid is supplied between the material to be polished and the polishing pad, and the base substrate and the polishing platen are moved relative to each other to polish the surface to be polished of the material to be polished. In the polishing step, for example, at least a part of the material to be polished is removed by polishing.

As the base substrate that is to be polished, a substrate to be polished or the like is exemplified. As the substrate to be polished, for example, a base substrate in which a material to be polished is formed on a substrate for semiconductor element production (for example, a semiconductor substrate in which an STI pattern, a gate pattern, a wiring pattern, or the like is formed) is exemplified. Examples of the material to be polished include an insulating material such as silicon oxide; and a stopper material such as polysilicon or silicon nitride. The material to be polished may be a single material or a plurality of materials. In a case where a plurality of materials are exposed on the surface to be polished, they can be considered as the material to be polished. The material to be polished may be in the form of a film (film to be polished) or may be a silicon oxide film, a polysilicon film, a silicon nitride film, or the like.

By polishing a material to be polished (for example, an insulating material such as silicon oxide) formed on such a substrate with the polishing liquid and removing an excess part, it is possible to eliminate irregularities on the surface of the material to be polished and to produce a smooth surface over the entire surface of the polished material. The polishing liquid of the present embodiment is preferably used for polishing a surface to be polished containing silicon oxide.

In the present embodiment, it is possible to polish an insulating material of a base substrate having an insulating material containing silicon oxide on at least the surface, a stopper (polishing stop layer) disposed as an underlayer of the insulating material, and a substrate (semiconductor substrate or the like) disposed under the stopper. The stopper material constituting the stopper is a material having a lower polishing rate than that for insulating material, and is preferably polysilicon, silicon nitride, or the like. In such a base substrate, by stopping polishing when the stopper is exposed, it is possible to prevent the insulating material from being excessively polished, and thus flatness of the insulating material after polishing can be improved.

Examples of a method for forming a material to be polished by the polishing liquid of the present embodiment include a CVD method such as a low-pressure CVD method, a normal-pressure CVD method, or a plasma CVD method; and a rotation application method in which a liquid raw material is applied to a rotating substrate.

Hereinafter, the polishing method of the present embodiment will be described by taking a polishing method for a base substrate (for example, a base substrate having an insulating material formed on a semiconductor substrate) as an example. In the polishing method of the present embodiment, as a polishing apparatus, it is possible to use a common polishing apparatus which has a holder capable of holding a base substrate having a surface to be polished and a polishing platen to which a polishing pad can be pasted. A motor or the like in which the number of rotations can be changed is attached to each of the holder and the polishing platen. As the polishing apparatus, for example, a polishing apparatus: Reflexion manufactured by Applied Materials, Inc. can be used.

As the polishing pad, common unwoven cloth, a foamed body, an unfoamed body, and the like can be used. As the material of the polishing pad, it is possible to use a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimidamide, a polysiloxane copolymer, an oxirane compound, a phenolic resin, polystyrene, polycarbonate, or an epoxy resin. As the material of the polishing pad, particularly, at least one selected from the group consisting of foamed polyurethane and unfoamed polyurethane is preferable from the viewpoint of being further excellent in polishing rate and flatness. It is preferable that the polishing pad is subjected to grooving so that the polishing liquid is pooled.

Polishing conditions are not particularly limited, but the upper limit of the rotation speed of the polishing platen is preferably 200 min$^{-1}$ or less such that the base substrate is not let out, and the upper limit of the polishing pressure to be applied to the base substrate (processing load) is preferably 15 psi or less from the viewpoint of sufficiently suppressing the generation of polishing scratches. The polishing liquid is preferably continuously supplied to the polishing pad with a pump or the like during polishing. The amount supplied for this is not particularly limited, but it is preferable that the surface of the polishing pad is always covered with the polishing liquid.

The base substrate after the completion of polishing is preferably thoroughly washed in flowing water to remove the particles adhering to the base substrate. For the washing, dilute hydrofluoric acid or ammonia water may be concurrently used in addition to pure water, and a brush may be concurrently used to increase the washing efficiency. Further, it is preferable that, after washing, the water droplets adhering to the base substrate are removed off using a spin dryer or the like, and then the base substrate is dried.

The polishing liquid, the polishing liquid set, and the polishing method of the present embodiment can be suitably used in formation of an STI. For the formation of the STI, the lower limit of the polishing rate ratio of the insulating material (for example, silicon oxide) to the stopper material (for example, silicon nitride and polysilicon) is preferably 20 or more, more preferably 25 or more, further preferably 50 or more, and particularly preferably 80 or more. When the polishing rate ratio is less than 80, the magnitude of the polishing rate for the insulating material with respect to the polishing rate for the stopper material is small, and thus, it will tend to be difficult to stop polishing at a predetermined position during formation of the STI. On the other hand, when the polishing rate ratio is 20 or more, it will be easier to stop polishing, which is further suitable for STI formation. The lower limit of the polishing rate for the insulating material (for example, silicon oxide) is preferably 70 nm/min or more, more preferably 80 nm/min or more, further preferably 100 nm/min or more, particularly preferably 150 nm/min or more, extremely preferably 180 nm/min or more, and very preferably 200 nm/min or more. The upper limit of the polishing rate for the stopper material (for example, silicon nitride and polysilicon) is preferably 10 nm/min or less, more preferably 8 nm/min or less, further preferably 7 nm/min or less, particularly preferably 5 nm/min or less, and extremely preferably 3 nm/min or less.

The polishing liquid, the polishing liquid set, and the polishing method of the present embodiment can also be used in polishing of a pre-metal insulating material. As the pre-metal insulating material, in addition to silicon oxide, for example, phosphorus-silicate glass or boron-phosphorus-silicate glass is used, and further, silicon oxyfluoride, fluorinated amorphous carbon, and the like can also be used.

The polishing liquid, the polishing liquid set, and the polishing method of the present embodiment can also be applied to materials other than the insulating material such as silicon oxide. Examples of such a material include high permittivity materials such as Hf-based, Ti-based, and Ta-based oxides; semiconductor materials such as silicon, amorphous silicon, SiC, SiGe, Ge, GaN, GaP, GaAs, and organic semiconductors; phase-change materials such as GeSbTe; inorganic conductive materials such as ITO; and polymer resin materials such as polyimide-based, polybenzooxazole-based, acrylic, epoxy-based, and phenol-based materials.

The polishing liquid, the polishing liquid set, and the polishing method of the present embodiment can also be applied not only to film-like materials to be polished, but also to various types of substrates made of glass, silicon, SiC, SiGe, Ge, GaN, GaP, GaAs, sapphire, plastics, and the like.

The polishing liquid, the polishing liquid set, and the polishing method of the present embodiment can be used not only for production of semiconductor elements, but also for production of image display devices such as TFTs and organic ELs; optical parts such as photomasks, lenses, prisms, optical fibers, and single crystal scintillators; optical elements such as optical switching elements and optical waveguides; light-emitting elements such as solid lasers and blue laser LEDs; magnetic storage devices such as magnetic disks and magnetic heads; and the like.

EXAMPLES

Hereinafter, the present invention will be described in detail by means of Examples. However, the present invention is not limited to the following Examples.

<Preparation of Slurry>

(Preparation of Cerium Hydroxide Slurry)

[Synthesis of Hydroxide of Tetravalent Metal Element]

350 g of an aqueous 50% by mass $Ce(NH_4)_2(NO_3)_6$ solution (trade name: CAN50 liquid manufactured by Nihon Kagaku Sangyo Co., Ltd.) was mixed with 7825 g of pure water to obtain a solution. Next, while stirring this solution, 750 g of an aqueous imidazole solution (10% by mass aqueous solution, 1.47 mol/L) was added dropwise at a mixing rate of 5 mL/min to obtain a precipitate containing cerium hydroxide. The cerium hydroxide was synthesized at a temperature of 25° C. and a stirring speed of 400 min$^{-1}$. The stirring was carried out using a 3-blade pitch paddle with a total blade section length of 5 cm.

The obtained precipitate (precipitate containing cerium hydroxide) was subjected to centrifugal separation (4000 min$^{-1}$, for 5 minutes), and then subjected to solid-liquid separation with removal of a liquid phase by decantation. 10 g of particles obtained by solid-liquid separation and 990 g of water were mixed, and the particles were dispersed in the water by using an ultrasonic cleaner to prepare a cerium hydroxide slurry (content of particles: 1.0% by mass) containing particles containing cerium hydroxide (abrasive grains; hereinafter, referred to as "cerium hydroxide particles").

[Measurement of Average Particle Diameter]

Upon measurement of the average particle diameter (average secondary particle diameter) of the cerium hydroxide particles in the cerium hydroxide slurry using trade name: N5 manufactured by Beckman Coulter, Inc., a value of 25 nm was obtained. The measuring method was as follows. First, about 1 mL of a measuring sample (cerium hydroxide slurry, aqueous dispersion) containing 1.0% by mass of cerium hydroxide particles was poured in a 1-cm square cell, and the cell was set in the N5. Measurement was performed at 25° C. with the refractive index set to 1.333 and the viscosity set to 0.887 mPa·s as the measuring sample information of N5 software, and the value indicated as Unimodal Size Mean was read off.

[Measurement of Zeta Potential]

An appropriate amount of the cerium hydroxide slurry was charged into trade name: DelsaNano C manufactured by Beckman Coulter, Inc. and measurement was performed at 25° C. two times. An average value of shown zeta potentials was obtained as the zeta potential. The zeta potential of cerium hydroxide particles in the cerium hydroxide slurry was +50 mV.

[Structural Analysis of Abrasive Grains]

An appropriate amount of the cerium hydroxide slurry was taken and vacuum dried to isolate the abrasive grains, and then sufficiently washed with pure water to obtain a sample. When the obtained sample was measured by FT-IR ATR method, a peak based on nitrate ion ($NO_3^-$) was observed in addition to a peak based on hydroxide ion ($OH^-$). Further, when the same sample was measured by XPS (N-XPS) for nitrogen, a peak based on nitrate ion was observed while no peak based on $NH_4^+$ was observed. These results confirmed that the abrasive grains contained in the cerium hydroxide slurry at least partially contained particles having nitrate ion bonded to a cerium element. Further, since particles having hydroxide ion bonded to a cerium element were at least partially contained in the abrasive grains, it was confirmed that the abrasive grains contained cerium hydroxide. These results confirmed that the cerium hydroxide contained a hydroxide ion bonded to a cerium element.

[Measurement of Absorbance and Light Transmittance]

An appropriate amount of the cerium hydroxide slurry was taken and diluted with water such that the abrasive grain content became 0.0065% by mass (65 ppm), to obtain a measuring sample (aqueous dispersion). About 4 mL of this measuring sample was placed in a 1-cm square cell, and the cell was set in a spectrophotometer (device name: U3310) manufactured by Hitachi, Ltd. Absorbance measurement in a wavelength range of 200 to 600 nm was performed to measure the absorbance with respect to light having a wavelength of 290 nm and the absorbance with respect to light having a wavelength of 450 to 600 nm. The absorbance with respect to light having a wavelength of 290 nm was 1.192 and the absorbance with respect to light having a wavelength of 450 to 600 nm was less than 0.010.

About 4 mL of the cerium hydroxide slurry (content of particles: 1.0% by mass) was placed in a 1-cm square cell, and the cell was set in a spectrophotometer (device name: U3310) manufactured by Hitachi, Ltd. Absorbance measurement in a wavelength range of 200 to 600 nm was performed to measure the absorbance with respect to light having a wavelength of 400 nm and the light transmittance with respect to light having a wavelength of 500 nm. The absorbance with respect to light having a wavelength of 400 nm was 2.25 and the light transmittance with respect to light having a wavelength of 500 nm was 92%/cm.

(Preparation of Cerium Oxide Slurry)

100 g of ceria particles, 1 g of trade name: Polyacrylic Acid 5000 manufactured by Wako Pure Chemical Industries, Ltd. (dispersant, weight average molecular weight: 5000), and 399 g of deionized water were mixed to obtain a liquid mixture having a pH of 5.0. Next, while stirring the liquid mixture, the liquid mixture was subjected to an ultrasonic treatment for 30 minutes to perform a dispersion treatment. Thereafter, it was left to stand still for 15 hours and then a supernatant solution was fractionated. The solid content of the obtained supernatant solution was adjusted to 5.0% by mass, thereby obtaining a cerium oxide slurry which contains particles containing cerium oxide (abrasive grains; hereinafter, referred to as "cerium oxide particles").

[Measurement of Average Particle Diameter]

An appropriate amount of the cerium oxide slurry was charged into trade name: Microtrac MT3300EXII manufactured by MicrotracBEL Corp., the average particle diameter of the cerium oxide particles was measured, and the shown average particle diameter value was obtained as the average particle diameter (average secondary particle diameter). The average particle diameter of the cerium oxide particles in the cerium oxide slurry was 150 nm.

[Measurement of Zeta Potential]

An appropriate amount of the cerium oxide slurry was charged into trade name: DelsaNano C manufactured by Beckman Coulter, Inc. and measurement was performed at 25° C. two times. An average value of shown zeta potentials was obtained as the zeta potential. The zeta potential of cerium oxide particles in the cerium oxide slurry was −50 mV.

<Preparation of Abrasive Grain Liquid Mixture>

600 g of the cerium hydroxide slurry, 600 g of the cerium oxide slurry, and 800 g of ion-exchange water were mixed and then stirred for 30 minutes at the number of rotations of 300 rpm using a stirring blade having two blades to prepare an abrasive grain liquid mixture.

<Preparation of Polishing Liquid for CMP>

Example 1

100 g of an additive liquid containing 1.0% by mass of a hydroxy acid [manufactured by Tokyo Chemical Industry Co., Ltd., DL-lactic acid (hydroxyl value: 623)], 5.0% by mass of a polyol [trade name: TMP-60 manufactured by NIPPON NYUKAZAI CO., LTD., polyoxyethylene trimethylolpropane], 0.06% by mass of a cationic compound [manufactured by Tokyo Chemical Industry Co., Ltd., trimethyl-2-methacryloyloxyethyl ammonium chloride (Mw:

207)], and 93.94% by mass of water, 100 g of the abrasive grain liquid mixture, and 750 g of water were mixed. Then, 1.0% by mass of an aqueous ammonium solution was added to adjust the pH of the polishing liquid to 4.0, and then water was added to adjust the total amount to 1000 g. According to this, a polishing liquid for CMP (1000 g) containing 0.18% by mass of the abrasive grains (cerium hydroxide particles: 0.03% by mass, cerium oxide particles: 0.15% by mass), 0.10% by mass of the hydroxy acid, 0.50% by mass of the polyol, and 0.006% by mass of the cationic compound was prepared.

Example 2

A polishing liquid for CMP was prepared in the same manner as in Example 1, except that the hydroxy acid was changed to 2,2-bis(hydroxymethyl)propionic acid [manufactured by Tokyo Chemical Industry Co., Ltd., hydroxyl value: 837] and the cationic compound was changed to 3-(methacryloylamino)propyl trimethylammonium chloride [manufactured by Tokyo Chemical Industry Co., Ltd., Mw: 220].

Example 3

A polishing liquid for CMP was prepared in the same manner as in Example 1, except that the hydroxy acid was changed to 2,2-bis(hydroxymethyl)butyric acid [manufactured by Tokyo Chemical Industry Co., Ltd., hydroxyl value: 757].

Example 4

A polishing liquid for CMP was prepared in the same manner as in Example 1, except that the hydroxy acid was changed to 2,2-bis(hydroxymethyl)butyric acid [manufactured by Tokyo Chemical Industry Co., Ltd., hydroxyl value: 757] and the cationic compound was changed to 3-(methacryloylamino)propyl trimethylammonium chloride [manufactured by Tokyo Chemical Industry Co., Ltd., Mw: 220].

Example 5

A polishing liquid for CMP was prepared in the same manner as in Example 1, except that the hydroxy acid was changed to DL-glyceric acid [manufactured by Tokyo Chemical Industry Co., Ltd., hydroxyl value: 1058] and the cationic compound was changed to 3-(methacryloylamino) propyl trimethylammonium chloride [manufactured by Tokyo Chemical Industry Co., Ltd., Mw: 220].

Example 6

A polishing liquid for CMP was prepared in the same manner as in Example 1, except that the polyol was changed to ethylene diamine tetrapolyoxyethylene polyoxypropylene [trade name: ADEKA PLURONIC TR-913R manufactured by ADEKA Corporation].

Example 7

A polishing liquid for CMP was prepared in the same manner as in Example 1, except that the polyol was changed to polyoxypropylene sorbitol ether [trade name: SANNIX SP-750 manufactured by Sanyo Chemical Industries, Ltd.].

Example 8

A polishing liquid for CMP was prepared in the same manner as in Example 1, except that the content of the cationic compound was changed to 0.0008% by mass.

Comparative Example 1

100 g of the abrasive grain liquid mixture was mixed with 850 g of water. Thereafter, 1.0% by mass of an aqueous ammonium solution was added to adjust the pH of the polishing liquid to 4.0. Then, water was added to adjust the total amount to 1000 g. According to this, a polishing liquid for CMP containing 0.18% by mass of abrasive grains was prepared.

Comparative Example 2

A polishing liquid for CMP was prepared in the same manner as in Example 1, except that the cationic compound was excluded from the polishing liquid in Example 1.

Comparative Example 3

A polishing liquid for CMP was prepared in the same manner as in Example 1, except that the polyol was excluded from the polishing liquid in Example 1.

Comparative Example 4

A polishing liquid for CMP was prepared in the same manner as in Example 1, except that the cationic compound in Example 1 was changed to polyallylamine [trade name: PAA-01 manufactured by NITTOBO MEDICAL CO., LID., Mw: 1000 (value in the manufacturer's catalogue)].

Comparative Example 5

A polishing liquid for CMP was prepared in the same manner as in Example 1, except that the cationic compound in Example 1 was changed to polyallylamine [trade name: PAA-15 manufactured by NITTOBO MEDICAL CO., LTD., Mw: 15000 (value in the manufacturer's catalogue)].

<Physical Properties of Polishing Liquid>

The pH of the polishing liquid for CMP, and the average particle diameter and the zeta potential of the abrasive grains in the polishing liquid for CMP were evaluated under the following conditions. In each of Examples and Comparative Examples, the pH of the polishing liquid for CMP was 4.0, the average particle diameter of the abrasive grains was 150 nm, and the zeta potential of the abrasive grains was positive.

(pH)

Measurement temperature: 25±5° C.

Measurement apparatus: Model No. PHL-40 manufactured by DKK-TOA CORPORATION

Measurement method: after performing 2-point calibration using a standard buffer solution (phthalate pH buffer solution, pH: 4.01 (25° C.); neutral phosphate pH buffer solution, pH: 6.86 (25° C.)), an electrode was placed in the polishing liquid for CMP for 2 minutes or longer, and pH after stabilization was measured with the measurement apparatus above.

(Average Particle Diameter of Abrasive Grains)

An appropriate amount of the polishing liquid for CMP was charged into trade name: Microtrac MT3300EXII manufactured by MicrotracBEL Corp., the average particle diameter of the abrasive grains was measured, and the shown average particle diameter value was obtained as the average particle diameter (average secondary particle diameter).

(Zeta Potential of Abrasive Grains)

An appropriate amount of the polishing liquid for CMP was charged into trade name: DelsaNano C manufacture by Beckman Coulter, Inc. and measurement was performed at 25° C. two times. An average value of shown zeta potentials was obtained as the zeta potential.

<CMP Evaluation>

The polishing liquid for CMP was used for polishing of a substrate to be polished under the following polishing condition.

(CMP Polishing Conditions)

Polishing apparatus: Reflexion LK (manufactured by Applied Materials, Inc.)

Flow rate of polishing liquid for CMP: 200 mL/min

Substrate to be polished: non-pattern wafer and pattern wafer described below

Polishing pad: foamed polyurethane resin having closed cells (manufactured by Rohm & Haas Electronic Materials CMP Inc., Model No. IC1010)

Polishing pressure: 3.0 psi

Number of rotations of substrate to be polished and polishing platen: substrate to be polished/polishing platen=93/87 rpm Polishing time: A non-pattern wafer was polished for 1 minute. A pattern wafer was polished until a stopper film was exposed. In addition, after the stopper film is exposed, additional polishing was performed for the same time as the polishing time taken for exposing the stopper film to confine the degree of progress of dishing.

Washing of wafer: After a CMP treatment, washing was performed by water with ultrasonic application, and then drying was performed with a spin dryer.

[Non-Pattern Wafer]

As a blanket wafer with no patterns formed, a substrate to be polished having a silicon oxide film with a thickness of 1 μm formed on a silicon substrate by a plasma CVD method, a substrate to be polished having a silicon nitride film with a thickness of 0.2 μin framed on a silicon substrate by a CVD method, and a substrate to be polished having a polysilicon film with a thickness of 0.2 μm formed on a silicon substrate by a plasma CVD method were used.

[Pattern Wafer]

As a pattern wafer with a simulated pattern formed, 764 wafer (trade name, diameter: 300 mm) manufactured by SEMATECH was used. This pattern wafer was a wafer obtained by stacking a silicon nitride film or a polysilicon film as a stopper film on a silicon substrate, then forming a trench in an exposure step, and stacking a silicon oxide film ($SiO_2$ film) as an insulating film on the silicon substrate and the stopper film so as to fill the stopper film and the trench. The silicon oxide film was for lied by HDP (High Density Plasma) method.

As the pattern wafer, a wafer having a part with a line (convex portion) and space (concave portion) having a pitch of 100 μm and a convex pattern density of 50% was used. The line and space is a simulated pattern, and is a pattern in which an Active portion masked by the stopper film as the convex portion and a Trench portion with a groove formed as the concave portion are alternately arranged. For example, the phrase "a line and space having a pitch of 100 μm" means that the total of the widths of a line portion and a space portion is 100 μm. In addition, for example, the phrase "a line and space having a pitch of 100 μm and a convex pattern density of 50%" means a pattern in which a convex portion having a width of 50 μm and a concave portion having a width of 50 μm are alternately arranged.

Figure 3:
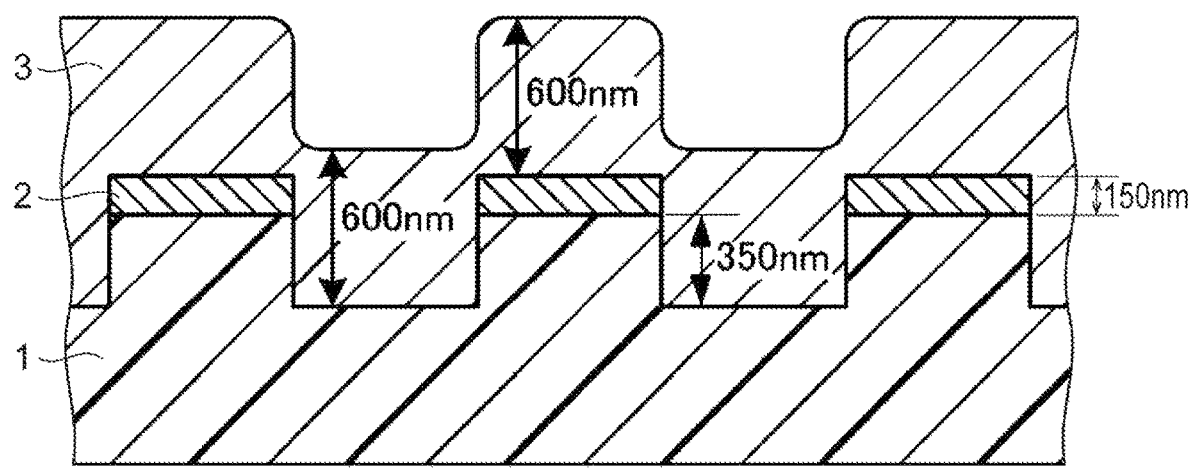
FIG. 3 is a schematic cross-sectional view illustrating a pattern wafer used in Examples.

The thickness of the silicon oxide film in the pattern wafer was 600 nm on each of the silicon substrate and the stopper film. Specifically, as illustrated in FIG. 3, the thickness of a stopper film 2 on a silicon substrate 1 was 150 nm, the thickness of the convex portion of a silicon oxide film 3 was 600 nm, the thickness of the concave portion of the silicon oxide film 3 was 600 nm, and the depth of the concave portion of the silicon oxide film 3 was 500 nm (depth of trench: 350 nm+thickness of stopper film: 150 nm).

In the polishing evaluation of the pattern wafer, a wafer in which the remaining step height becomes about 30 nm by polishing the wafer described above by using a known polishing liquid for CMP having self-stopping property (property of reducing the polishing rate in accordance with a decrease in the remaining step height in the simulated pattern) was used. Specifically, a wafer, which was polished until the thickness of the silicon oxide film of the convex portion in a pitch of 100 μm and a density pattern of 50% reached 50 nm using a polishing liquid obtained by mixing HS-8005-D4 (trade name) manufactured by Hitachi Chemical Company, Ltd., HS-7303GP (trade name) manufactured by Hitachi Chemical Company, Ltd., and water at a ratio of 2:1.2:6.8, was used.

(Items of Polished Product Evaluation)

[Evaluation of Blanket Wafer (Polishing Rate)]

Regarding the substrate to be polished which had been polished and washed under the above-described condition, the polishing rates of the films to be polished (the silicon oxide film, the silicon nitride film, and the polysilicon film) (the polishing rate for the silicon oxide film: $SiO_2RR$, the polishing rate for the silicon nitride film: SiNRR, and the polishing rate for the polysilicon film: p-SiRR) were obtained by the following formula. Incidentally, a difference in film thickness of each film to be polished before and after polishing was obtained by using a light interference-type film thickness measuring apparatus (trade name: F80 manufactured by Filmetrics Japan, Inc.). In addition, the polishing rate ratio ($SiO_2RR/SiNRR$ and $SiO_2RR/p-SiRR$) was obtained by using the polishing rate for each film to be polished.

Polishing rate (RR)=(difference in film thickness (nm) of each film to be polished before and after polishing)/(polishing time (min))

[Pattern Wafer Evaluation]

The evaluation of the pattern wafer was performed in Examples 1 to 3, 6, and 7 and Comparative Examples 1 to 3. The remaining film thicknesses of the stopper films (the silicon nitride film and the polysilicon film) of the convex portion and the remaining film thickness of the silicon oxide film of the concave portion of the pattern wafer which had been polished and washed under the above-described condition were measured to obtain a remaining step height by using the following formula. In the formula, "350 nm+remaining film thickness (nm) of stopper film" represents a film thickness of the convex portion. In addition, the scrapped amount of the stopper film (hereinafter, referred to as "stopper film loss amount") was obtained using a difference between the initial thickness of the stopper film and the thickness of the stopper film after polishing (remaining film thickness) by the following formula. Incidentally, the thickness of each film to be polished before and after polishing was obtained by using a light interference-type film thickness measuring apparatus (trade name: Nanospec AFT-5100 manufactured by Nanometrics Incorporated).

Remaining step height=(350 nm+remaining film thickness (nm) of stopper film)−(remaining film thickness (nm) of silicon oxide film of concave portion)

Stopper film loss amount=1500 nm−remaining film thickness (nm) of stopper film of convex portion The measurement results obtained in Examples and Comparative Examples are shown in Table 1 and Table 2. Compounds A to D described in tables mean the following compounds.

Compound A: trimethyl-2-methacryloyloxyethyl ammonium chloride
Compound B: 3-(methacryloylamino)propyl trimethylammonium chloride
Compound C: polyallylamine (PAA-01)
Compound D: polyallylamine (PAA-15)

TABLE 1

| | | | Example | | | | |
|---|---|---|---|---|---|---|---|
| Item | | | 1 | 2 | 3 | 4 | 5 |
| Hydroxy acid | | Type | DL-lactic acid | 2,2-Bis(hydroxymethyl)propionic acid | | 2,2-Bis(hydroxymethyl)butyric acid | DL-glyceric acid |
| | | Hydroxyl value | 623 | 837 | | 757 | 1058 |
| | | Content (% by mass) | | | 0.10 | | |
| Polyol | | Type | | | TMP-60 | | |
| | | Content (% by mass) | | | 0.50 | | |
| Cationic compound | | Type | Compound A | Compound B | | Compound A | Compound B |
| | | Weight average molecular weight [Mw] | 207 | 220 | | 207 | 220 |
| | | Content (% by mass) | | | 0.006 | | |
| pH adjusting agent | | Type | | | Ammonia | | |
| Blanket wafer evaluation | Polishing rate | Silicon oxide film (Ox) (nm/min) | 320 | 300 | 260 | 250 | 340 |
| | | Silicon nitride film (SiN) (nm/min) | 2 | 1 | 1 | 1 | 2 |
| | | Polysilicon film (pSi) (nm/min) | 3 | 3 | 2 | 2 | 3 |
| | Polishing rate ratio | Ox/SiN | 160 | 300 | 260 | 250 | 170 |
| | | Ox/pSi | 107 | 100 | 130 | 125 | 113 |
| Pattern wafer evaluation [100 μm pitch 50% density] | | Polishing time (sec) | 9 | 18 | 10 | 20 | 12 | 24 | — | — | — | — |
| | SiN | Remaining step height (nm) | 10 | 19 | 8 | 16 | 6 | 13 | — | — | — | — |
| | | Stopper film loss amount (nm) | 2 | 5 | 1 | 3 | 1 | 2 | — | — | — | — |
| | pSi | Remaining step height (nm) | 5 | 10 | 3 | 8 | 3 | 7 | — | — | — | — |
| | | Stopper film loss amount (nm) | 2 | 3 | 2 | 4 | 2 | 3 | — | — | — | — |

| | | | Example | | |
|---|---|---|---|---|---|
| Item | | | 6 | 7 | 8 |
| Hydroxy acid | | Type | | DL-lactic acid | |
| | | Hydroxyl value | | 623 | |
| | | Content (% by mass) | | 0.10 | |
| Polyol | | Type | TR-913R | SP-750 | TMP-60 |
| | | Content (% by mass) | | 0.50 | |
| Cationic compound | | Type | | Compound A | |
| | | Weight average molecular weight [Mw] | | 207 | |
| | | Content (% by mass) | | 0.006 | 0.0008 |
| pH adjusting agent | | Type | | Ammonia | |
| Blanket wafer evaluation | Polishing rate | Silicon oxide film (Ox) (nm/min) | 280 | 380 | 330 |
| | | Silicon nitride film (SiN) (nm/min) | 1 | 3 | 2 |
| | | Polysilicon film (pSi) (nm/min) | 1 | 3 | 15 |
| | Polishing rate ratio | Ox/SiN | 280 | 127 | 165 |
| | | Ox/pSi | 280 | 127 | 22 |

TABLE 1-continued

|  |  |  |  |  |  |  |  |  |
|---|---|---|---|---|---|---|---|---|
|  | Pattern wafer evaluation [100 μm pitch 50% density] | Polishing time (sec) |  | 11 | 22 | 8 | 16 | 9 | 18 |
|  |  | SiN | Remaining step height (nm) | 9 | 16 | 12 | 20 | 12 | 21 |
|  |  |  | Stopper film loss amount (nm) | 1 | 3 | 2 | 5 | 3 | 5 |
|  |  | pSi | Remaining step height (nm) | 8 | 15 | 7 | 15 | 8 | 14 |
|  |  |  | Stopper film loss amount (nm) | 2 | 4 | 3 | 5 | 6 | 13 |

TABLE 2

| | | Comparative Example | | | | |
|---|---|---|---|---|---|---|
| Item | | 1 | 2 | 3 | 4 | 5 |
| Hydroxy acid | Type | — | | DL-lactic acid | | |
| | Hydroxyl value | — | | 623 | | |
| | Content (% by mass) | — | | 0.10 | | |
| Polyol | Type | — | TMP-60 | — | | TMP-60 |
| | Content (% by mass) | — | 0.50 | — | | 0.50 |
| Cationic compound | Type | — | — | Compound A | Compound C | Compound D |
| | Weight average molecular weight [Mw] | — | — | 207 | 1000 | 15000 |
| | Content (% by mass) | — | — | | 0.006 | |
| pH adjusting agent | Type | — | | Ammonia | | |
| Blanket wafer evaluation | Polishing rate | Silicon oxide film (Ox) (nm/min) | 750 | 380 | 460 | 30 | 20 |
| | | Silicon nitride film (SiN) (nm/min) | 120 | 6 | 6 | 2 | 2 |
| | | Polysilicon film (pSi) (nm/min) | 40 | 30 | 24 | 2 | 2 |
| | Polishing rate ratio | Ox/SiN | 6 | 63 | 77 | 15 | 10 |
| | | Ox/pSi | 19 | 13 | 19 | 15 | 10 |
| Pattern wafer evaluation [100 μm pitch 50% density] | | Polishing time (sec) | 4  8 | 8  16 | 7  14 | — | — |
| | SiN | Remaining step height (nm) | 15  50 | 11  21 | 13  28 | — | — |
| | | Stopper film loss amount (nm) | 8  20 | 3  6 | 3  7 | — | — |
| | pSi | Remaining step height (nm) | 14  55 | 15  52 | 18  60 | — | — |
| | | Stopper film loss amount (nm) | 8  15 | 8  13 | 7  12 | — | — |

Hereinafter, the results shown in Table 1 and Table 2 will be described in detail.

In the blanket wafer evaluation in Example 1, $SiO_2RR$ was 320 nm/min, SiNRR was 2 nm/min, pSiRR was 3 nm/min, the polishing rate ratio $SiO_2$/SiN was 160, the polishing rate ratio $SiO_2$/pSi was 107, and higher polishing selectivity than those in Comparative Examples was obtained. In the pattern wafer evaluation, the remaining step heights at the point of time when the stopper films were exposed were respectively 10 nm (silicon nitride film) and 5 nm (polysilicon film), and the remaining step heights were respectively 19 nm and 10 nm even if grinding was conducted for additional 9 seconds. In addition, the stopper film loss amounts at the point of time when the stopper films were exposed were respectively 2 nm (silicon nitride film) and 2 nm (polysilicon film), and the stopper film loss amounts were respectively 5 nm and 3 nm even if grinding was conducted for additional 9 seconds.

In this way, in Example 1, the result that both the dishing and the stopper film loss amount were reduced as compared to Comparative Examples was obtained.

In the blanket wafer evaluation in Example 2, $SiO_2RR$ was 300 nm/min, SiNRR was 1 nm/min, pSiRR was 3 nm/min, the polishing rate ratio $SiO_2$/SiN was 300, the polishing rate ratio $SiO_2$/pSi was 100, and higher polishing selectivity than those in Comparative Examples was obtained. In the pattern wafer evaluation, the remaining step heights at the point of time when the stopper films were exposed were respectively 8 nm (silicon nitride film) and 3 nm (polysilicon film), and the remaining step heights were respectively 16 nm and 8 nm even if grinding was conducted for additional 10 seconds. In addition, the stopper film loss amounts at the point of time when the stopper films were exposed were respectively 1 nm (silicon nitride film) and 2 nm (polysilicon film), and the stopper film loss amounts were respectively 3 nm and 4 nm even if grinding was conducted for additional 10 seconds. In this way, in Example 2, the result that both the dishing and the stopper film loss amount were reduced as compared to Comparative Examples was obtained.

In the blanket wafer evaluation in Example 3, $SiO_2RR$ was 260 nm/min, SiNRR was 1 nm/min, pSiRR was 2 nm/min, the polishing rate ratio $SiO_2/SiN$ was 260, the polishing rate ratio $SiO_2/pSi$ was 130, and higher polishing selectivity than those in Comparative Examples was obtained. In the pattern wafer evaluation, the remaining step heights at the point of time when the stopper films were exposed were respectively 6 nm (silicon nitride film) and 3 nm (polysilicon film), and the remaining step heights were respectively 13 nm and 7 nm even if grinding was conducted for additional 12 seconds. In addition, the stopper film loss amounts at the point of time when the stopper films were exposed were respectively 1 nm (silicon nitride film) and 2 nm (polysilicon film), and the stopper film loss amounts were respectively 2 nm and 3 nm even if grinding was conducted for additional 12 seconds. In this way, in Example 3, the result that both the dishing and the stopper film loss amount were reduced as compared to Comparative Examples was obtained.

In the blanket wafer evaluation in Example 4, $SiO_2RR$ was 250 nm/min, SiNRR was 1 nm/min, pSiRR was 2 nm/min, the polishing rate ratio $SiO_2/SiN$ was 250, the polishing rate ratio $SiO_2/pSi$ was 125, and higher polishing selectivity than those in Comparative Examples was obtained.

In the blanket wafer evaluation in Example 5, $SiO_2RR$ was 340 nm/min, SiNRR was 2 nm/min, pSiRR was 3 nm/min, the polishing rate ratio $SiO_2/SiN$ was 170, the polishing rate ratio $SiO_2/pSi$ was 113, and higher polishing selectivity than those in Comparative Examples was obtained.

In the blanket wafer evaluation in Example 6, $SiO_2RR$ was 280 nm/min, SiNRR was 1 nm/min, pSiRR was 1 nm/min, the polishing rate ratio $SiO_2/SiN$ was 280, the polishing rate ratio $SiO_2/pSi$ was 280, and higher polishing selectivity than those in Comparative Examples was obtained. In the pattern wafer evaluation, the remaining step heights at the point of time when the stopper films were exposed were respectively 9 nm (silicon nitride film) and 8 nm (polysilicon film), and the remaining step heights were respectively 16 nm and 15 nm even if grinding was conducted for additional 11 seconds. In addition, the stopper film loss amounts at the point of time when the stopper films were exposed were respectively 1 nm (silicon nitride film) and 2 nm (polysilicon film), and the stopper film loss amounts were respectively 3 nm and 4 nm even if grinding was conducted for additional 11 seconds. In this way, in Example 6, the result that both the dishing and the stopper film loss amount were reduced as compared to Comparative Examples was obtained.

In the blanket wafer evaluation in Example 7, $SiO_2RR$ was 380 nm/min, SiNRR was 3 nm/min, pSiRR was 3 nm/min, the polishing rate ratio $SiO_2/SiN$ was 127, the polishing rate ratio $SiO_2/pSi$ was 127, and higher polishing selectivity than those in Comparative Examples was obtained. In the pattern wafer evaluation, the remaining step heights at the point of time when the stopper films were exposed were respectively 12 nm (silicon nitride film) and 7 nm (polysilicon film), and the remaining step heights were respectively 20 nm and 15 nm even if grinding was conducted for additional 8 seconds. In addition, the stopper film loss amounts at the point of time when the stopper films were exposed were respectively 2 nm (silicon nitride film) and 3 nm (polysilicon film), and the stopper film loss amounts were respectively 5 nm and 5 nm even if grinding was conducted for additional 8 seconds. In this way, in Example 7, the result that both the dishing and the stopper film loss amount were reduced as compared to Comparative Examples was obtained.

In the blanket wafer evaluation in Example 8, $SiO_2RR$ was 330 nm/min, SiNRR was 2 nm/min, pSiRR was 15 nm/min, the polishing rate ratio $SiO_2/SiN$ was 165, the polishing rate ratio $SiO_2/pSi$ was 22, and higher polishing selectivity than those in Comparative Examples was obtained. In the pattern wafer evaluation, the remaining step heights at the point of time when the stopper films were exposed were respectively 12 nm (silicon nitride film) and 8 nm (polysilicon film), and the remaining step heights were respectively 21 nm and 14 nm even if grinding was conducted for additional 9 seconds. In addition, the stopper film loss amounts at the point of time when the stopper films were exposed were respectively 3 nm (silicon nitride film) and 6 nm (polysilicon film), and the stopper film loss amounts were respectively 5 nm and 13 nm even if grinding was conducted for additional 9 seconds. In this way, in Example 8, the result that both the dishing and the stopper film loss amount were reduced as compared to Comparative Examples was obtained.

In the blanket wafer evaluation in Comparative Example 1, $SiO_2RR$ was 750 nm/min, SiNRR was 120 nm/min, pSiRR was 40 nm/min, the polishing rate ratio $SiO_2/SiN$ was 6, and the polishing rate ratio $SiO_2/pSi$ was 19. In the pattern wafer evaluation, the remaining step heights at the point of time when the stopper films were exposed were respectively 15 nm (silicon nitride film) and 14 nm (polysilicon film), and the remaining step heights after grinding was conducted for additional 4 seconds were respectively 50 nm and 55 nm. In addition, the stopper film loss amounts at the point of time when the stopper films were exposed were respectively 8 nm (silicon nitride film) and 8 nm (polysilicon film), and the stopper film loss amounts after grinding was conducted for additional 4 seconds were respectively 20 nm and 15 nm.

In the blanket wafer evaluation in Comparative Example 2, $SiO_2RR$ was 380 nm/min, SiNRR was 6 nm/min, pSiRR was 30 nm/min, the polishing rate ratio $SiO_2/SiN$ was 63, and the polishing rate ratio $SiO_2/pSi$ was 13. In the pattern wafer evaluation, the remaining step heights at the point of time when the stopper films were exposed were respectively 11 nm (silicon nitride film) and 15 nm (polysilicon film), and the remaining step heights after grinding was conducted for additional 8 seconds were respectively 21 nm and 52 nm. In addition, the stopper film loss amounts at the point of time when the stopper films were exposed were respectively 3 nm (silicon nitride film) and 8 nm (polysilicon film), and the stopper film loss amounts after grinding was conducted for additional 8 seconds were respectively 6 nm and 13 nm.

In the blanket wafer evaluation in Comparative Example 3, $SiO_2RR$ was 460 nm/min, SiNRR was 6 nm/min, pSiRR was 24 nm/min, the polishing rate ratio $SiO_2/SiN$ was 77, and the polishing rate ratio $SiO_2/pSi$ was 19. In the pattern wafer evaluation, the remaining step heights at the point of time when the stopper films were exposed were respectively 13 nm (silicon nitride film) and 18 nm (polysilicon film), and the remaining step heights after grinding was conducted for additional 7 seconds were respectively 28 nm and 60 nm. In addition, the stopper film loss amounts at the point of time when the stopper films were exposed were respectively 3 nm (silicon nitride film) and 7 nm (polysilicon film), and the stopper film loss amounts after grinding was conducted for additional 7 seconds were respectively 7 nm and 12 mm In the blanket wafer evaluation in Comparative Example 4, $SiO_2RR$ was 30 nm/min, SiNRR was 2 nm/min, pSiRR was 2 nm/min, the polishing rate ratio $SiO_2/SiN$ was 15, and the polishing rate ratio $SiO_2/pSi$ was 15.

In the blanket wafer evaluation in Comparative Example 5, $SiO_2RR$ was 20 nm/min, SiNRR was 2 nm/min, pSiRR was 2 nm/min, the polishing rate ratio $SiO_2/SiN$ was 10, and the polishing rate ratio $SiO_2/pSi$ was 10.

REFERENCE SIGNS LIST

1: silicon substrate, 2: stopper film, 3: silicon oxide film.

The invention claimed is:

1. A polishing liquid comprising: abrasive grains; a hydroxy acid component including a hydroxy acid including a hydroxyl group and a carboxyl group, the hydroxyl group not forming part of the carboxyl group; a polyol component; a cationic component comprising a cationic compound; and a liquid medium, wherein
the abrasive grains comprise more than 50% by mass of ceria based on the total mass of the abrasive grains,
a zeta potential of the abrasive grains is positive,
the polyol component comprises at least one selected from the group consisting of a polyoxyalkylene sorbitol ether, a polyoxyalkylene condensate of ethylenediamine, a polyoxyalkylene diglyceryl ether, a polyoxyalkylene trimethylolpropane ether, a polyoxyalkylene pentaerythritol ether, and a polyoxyalkylene methyl glucoside, and
a weight average molecular weight of the cationic compound of the cationic component is less than 1000.

2. The polishing liquid according to claim 1, wherein the polishing liquid does not comprise a polyol having an aromatic group.

3. The polishing liquid according to claim 1, wherein the hydroxy acid component contains a saturated monocarboxylic acid.

4. The polishing liquid according to claim 1, wherein a hydroxyl value of the hydroxy acid is 1500 or less.

5. The polishing liquid according to claim 1, wherein the abrasive grains further contain at least one selected from the group consisting of silica, alumina, zirconia, yttria, and a hydroxide of a tetravalent metal element.

6. The polishing liquid according to claim 1, wherein a content of the polyol component is 0.05 to 5.0% by mass.

7. The polishing liquid according to claim 1, wherein a content of the hydroxy acid component is 0.01 to 1.0% by mass.

8. The polishing liquid according to claim 1, wherein a content of the cationic component is 0.001 to 0.1% by mass.

9. The polishing liquid according to claim 1, wherein the polishing liquid is used for polishing a surface to be polished containing silicon oxide.

10. A polishing liquid set comprising:
constituent components of the polishing liquid according to claim 1, separately stored as a first liquid and a second liquid, wherein
the first liquid contains the abrasive grains and the liquid medium, and
the second liquid contains the hydroxy acid component, the polyol component, the cationic component, and the liquid medium.

11. A polishing method comprising a step of polishing a surface to be polished by using a polishing liquid obtained by mixing the first liquid and the second liquid of the polishing liquid set according to claim 10.

12. A polishing method for a base substrate having an insulating material and silicon nitride, the method comprising:
a step of selectively polishing the insulating material with respect to the silicon nitride by using a polishing liquid obtained by mixing the first liquid and the second liquid of the polishing liquid set according to claim 10.

13. A polishing method for a base substrate having an insulating material and polysilicon, the method comprising:
a step of selectively polishing the insulating material with respect to the polysilicon by using a polishing liquid obtained by mixing the first liquid and the second liquid of the polishing liquid set according to claim 10.

14. A polishing method comprising a step of polishing a surface to be polished by using the polishing liquid according to claim 1.

15. A polishing method for a base substrate having an insulating material and silicon nitride, the method comprising:
a step of selectively polishing the insulating material with respect to the silicon nitride by using the polishing liquid according to claim 1.

16. A polishing method for a base substrate having an insulating material and polysilicon, the method comprising:
a step of selectively polishing the insulating material with respect to the polysilicon by using the polishing liquid according to claim 1.

17. The polishing liquid according to claim 1, wherein the cationic component contains at least one selected from the group consisting of trimethyl-2-methacryloyloxyethyl ammonium chloride and 3-(methacryloylamino)propyl trimethylammonium chloride.

18. The polishing liquid according to claim 1, wherein the abrasive grains further contain particles containing a hydroxide of a tetravalent metal element in an amount ranging from 3% by mass to 20% by mass based on the total mass of the abrasive grains.

19. The polishing liquid according to claim 1, wherein a hydroxyl value of the hydroxy acid is 1000 or less.

20. The polishing liquid according to claim 1, wherein the cationic component comprises a plurality of cationic compounds.

21. The polishing liquid according to claim 20, wherein each of the plurality of cationic compounds has a weight average molecular weight of less than 1000.

* * * * *